(12) United States Patent
Floyd

(10) Patent No.: US 8,487,689 B2
(45) Date of Patent: Jul. 16, 2013

(54) LOAD SWITCH SYSTEM DRIVEN BY A CHARGE PUMP

(75) Inventor: Brian Harold Floyd, Sunnyvale, CA (US)

(73) Assignee: Aptus Power Semiconductor, Los Altos, CA (US)

( * ) Notice: Subject to any disclaimer, the term of this patent is extended or adjusted under 35 U.S.C. 154(b) by 219 days.

(21) Appl. No.: 12/986,155

(22) Filed: Jan. 6, 2011

(65) Prior Publication Data

US 2011/0163796 A1  Jul. 7, 2011

Related U.S. Application Data

(60) Provisional application No. 61/292,685, filed on Jan. 6, 2010.

(51) Int. Cl.
  *G05F 1/10*  (2006.01)
  *G05F 3/02*  (2006.01)
(52) U.S. Cl.
  USPC .......................................... 327/536; 327/427

(58) Field of Classification Search
  USPC ................................. 327/536–537, 427, 434
  See application file for complete search history.

(56) References Cited

U.S. PATENT DOCUMENTS

| | | | | |
|---|---|---|---|---|
| 5,426,334 | A * | 6/1995 | Skovmand | 327/427 |
| 6,388,506 | B1 * | 5/2002 | Voo | 327/536 |
| 7,253,676 | B2 * | 8/2007 | Fukuda et al. | 327/536 |
| 7,551,507 | B2 * | 6/2009 | Nakai et al. | 365/226 |
| 7,616,049 | B2 * | 11/2009 | Yoon | 327/536 |
| 7,821,328 | B2 * | 10/2010 | Hoque et al. | 327/536 |
| 2006/0152274 | A1 * | 7/2006 | Nakamura | 327/536 |
| 2011/0032026 | A1 * | 2/2011 | Pelley | 327/536 |

* cited by examiner

*Primary Examiner* — Quan Tra
(74) *Attorney, Agent, or Firm* — Venture Pacific Law, PC

(57) ABSTRACT

A method for operating a load switch, wherein a charge pump drives a gate of the load switch, comprises the steps of: controlling a charge pump frequency as a function of states of the load switch; generating a charge pump output as a function of the charge pump frequency; and providing the charge pump output to the gate of the load switch.

21 Claims, 24 Drawing Sheets

LOAD SWITCH SYSTEM DRIVEN BY A CHARGE PUMP

CROSS REFERENCE

This application claims priority from a provisional patent application entitled "Charge-pump system and circuit methodology for driving the gates of N-channel and P-channel load switches" filed on Jan. 6, 2010 and having an Application No. 61/292,685. Said application is incorporated herein by reference.

FIELD OF INVENTION

The invention relates to a load switch system and, in particular, to a load switch, where the gate of the load switch is driven by a charge pump.

BACKGROUND

In many electronics applications, it is desirable to increase the voltage of a power source to a higher voltage. A charge pump is a common circuit for increasing the power source by some multiple. Charge pump circuits are used to drive the gates of field effect transistors to voltage levels in excess of supply rail voltages. Typically, such circuits have been used to drive MOSFET transistors that switch power to electronic loads (e.g., load switches). For example, in portable computer applications, MOSFET power transistors are used to switch peripheral devices such as disk drives and displays. In such and other applications, the peripheral device is coupled to the source of the MOSFET switch while the MOSFET's drain is coupled to the supply rail. When a MOSFET switch is coupled in this way, it is desirable to drive the gate of the switch at voltages in excess of the supply rail voltage in order to fully turn on and enhance the switch.

Charge pump circuits used to drive MOSFET switches typically employ oscillators in conjunction with a small number of capacitors to multiply or boost the supply rail voltage to a higher gate voltage. In many applications, the power consumed by this type of circuit can be quite large due to the power consumed by the load and the load switch. Thus, the power efficiency of the load switch is generally of concern since in some battery-powered applications (such as mobile electronic devices, e.g., notebooks, cellular phones, electronic pads, etc.) power efficiency is very important. In these applications, the power efficiency of the load switch may be a factor in determining battery drain and, hence, battery life before recharging or replacement of the battery becomes necessary.

In view of the foregoing, it would therefore be desirable to provide a power efficient load switch which can rapidly multiply or boost a supply rail voltage so as to drive the gate of a load switch at a voltage in excess of the supply rail voltage and can be optimized to minimize quiescent-current loss.

SUMMARY OF INVENTION

An object of this invention is to provide methods and circuits for driving a gate of a load switch using a charge pump, where during the turn-on transient, the gate transient is controlled to limit excessive inrush current.

Another object of this invention is to provide methods and circuits for driving a gate of a load switch using a charge pump, where once the load switch has reached its steady state conduction mode, the load switch is optimized to minimize quiescent-current loss.

Yet another object of this invention is to provide methods and circuits for driving a gate of a load switch using a charge pump, where the gate is protected from excessive voltage to avoid exceeding the gate breakdown voltage.

Even more so, another object of this invention is provide methods and circuits for driving a gate of a load switch using a charge pump, where filtering is included to reduce circuit-induced gate noise.

Briefly, the present invention discloses methods and circuits for operating a load switch, wherein a charge pump drives a gate of the load switch, comprising the steps of: controlling a charge pump frequency as a function of states of the load switch; generating a charge pump output as a function of the charge pump frequency; and providing the charge pump output to the gate of the load switch.

An advantage of this invention is that methods and circuits for driving a gate of a load switch using a charge pump are provided, where during the turn-on transient, the gate transient is controlled to limit excessive inrush current.

Another advantage of this invention is that methods and circuits for driving a gate of a load switch using a charge pump are provided, where once the load switch has reached its steady state conduction mode, the load switch is optimized to minimize quiescent-current loss.

Yet another advantage of this invention is that methods and circuits for driving a gate of a load switch using a charge pump are provided, where the gate is protected from excessive voltage to avoid exceeding the gate breakdown voltage.

Even more so, another advantage of this invention is that methods and circuits for driving a gate of a load switch using a charge pump are provided, where filtering is included to reduce circuit-induced gate noise.

DESCRIPTION OF THE DRAWINGS

The foregoing and other objects, aspects, and advantages of the invention can be better understood from the following detailed description of the preferred embodiment of the invention when taken in conjunction with the accompanying drawings in which.

DETAILED DESCRIPTION OF THE PREFERRED EMBODIMENTS

The following circuit diagrams of the present invention, illustrated in the figures, can be understood by a person having ordinary skill in the art, e.g., an electrical engineer who designs integrated circuits using common-practiced techniques including hierarchical circuit design with schematic-entry tools.

Figure 1:
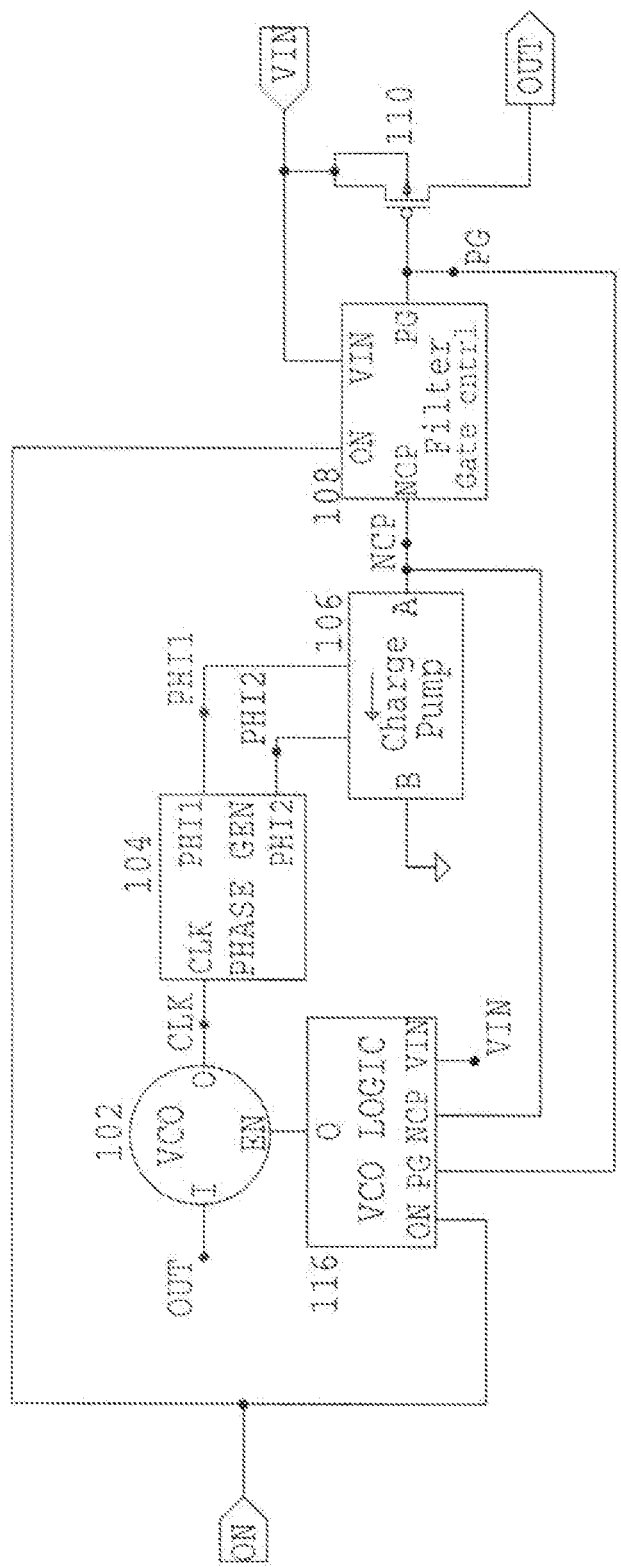
FIG. 1 illustrates a block diagram for a P-channel load switch system of the present invention.

FIG. 1 illustrates a block diagram for a P-channel load switch system of the present invention. A load switch 110 can be a P-channel MOSFET, comprising a body and a source connected to an input voltage VIN, a drain connected to a port having an output voltage OUT, and a gate having a gate voltage PG. The P-channel load switch system can be controlled by an input signal ON. The main components of this system are a voltage controlled oscillator ("VCO") 102, a VCO logic block 116, a charge pump phase generator block ("phase gen" or "phase generator") 104, a charge pump switch array block ("charge pump") 106, and a filter and gate control block ("Filter & Gate cntrl") 108. These blocks are connected to form a closed-loop system to control the gate of the P-channel MOSFET 110.

The VCO 102 is designed to output a clock signal CLK at its output ("O") port. An input ("I") of the VCO 102 can be connected to the output voltage OUT. The VCO 102 enable ("EN") pin is connected to an output port of the VCO logic block 116. The VCO logic block's 116 inputs are the input signal ON, the gate voltage PG, a negative charge pump voltage NCP, and the input voltage VIN. The phase generator 104 generates phase signals PHI1 and PHI2 for the charge pump 106. The charge pump 106 generates the negative voltage NCP in reference to a ground voltage ("ground"). The filter and gate control block 108 controls the gate voltage PG and can have the following as inputs: the voltage NCP, the input signal ON, and the input voltage VIN.

The circuit system of FIG. 1 provides optimal drive to the gate of the P-channel load switch 110. The gate drive to the P-channel load switch 110 can be a negative regulated voltage. When the input voltage VIN is too low to sufficiently drive the P-channel gate, the negative charge pump 106 can continuously drive the gate voltage PG low to provide sufficient gate drive. At higher input voltages of VIN, where the negative charge pump 106 is no longer required, the negative charge pump 106 can first drive the gate voltage PG to a value less than ground, or to a threshold value, and then turn off (i.e., the negative charge pump 106 can be disabled). The negative charge pump 106 can then remain off unless the gate voltage PG, for some reason, perhaps due to leakage, rises above ground. In this way, charge-pump switching loss is minimized.

Furthermore, the purpose of the VCO logic block 116 is to control the VCO 102 enable. The VCO 102 is designed to reduce its frequency once the output of the load switch system reaches its desired level. (Note, the frequency of a VCO can be referred to as a charge pump frequency since the frequency of the VCO directly affects the voltage output of a charge pump.) Thus, the charge pump 106 output can be controlled as a function of the charge pump frequency. In this way, overall switching loss is minimized. The filter and gate control block 108 serves as a filter between the negative charge pump output voltage NCP and the gate of the P-channel load switch 110; it also provides turn-off control. This complete system can provide a load switch integrated circuit.

A person having ordinary skill in the art relating to integrated circuit design can understand there are elements such as ESD, which may need to be added to the design. Furthermore, the layout may need to use process-relevant techniques. For instance, if the process uses a p-substrate, then the p-substrate may need to be connected to the most negative potential such as the voltage NCP, i.e., the negative voltage output of the charge-pump. Also, there are global nodes such as the input voltage VIN, ground, and substrate, which are not drawn for each block. In general, the input voltage VIN is the supply voltage, where a person having ordinary skill in circuit design can recognize that circuit blocks requiring a supply must use the input voltage VIN in this manner.

The input signal ON controls the charge pump and gate drive. Here, when the input signal ON transitions from low to high, the gate voltage PG is pulled from the input voltage VIN to a value less than ground through the negative charge pump 106. When the input signal ON transitions from high to low, the negative charge pump 106 turns off and the gate voltage PG is pulled high to the input voltage VIN to turn off the P-channel load switch 110. Although not shown in this diagram, the input logic can also be reversed so that, when the input signal ON is low, the P-channel load switch 110 turns on. In that case, a more appropriate name for the input signal ON can be "GATE".

Figure 2:
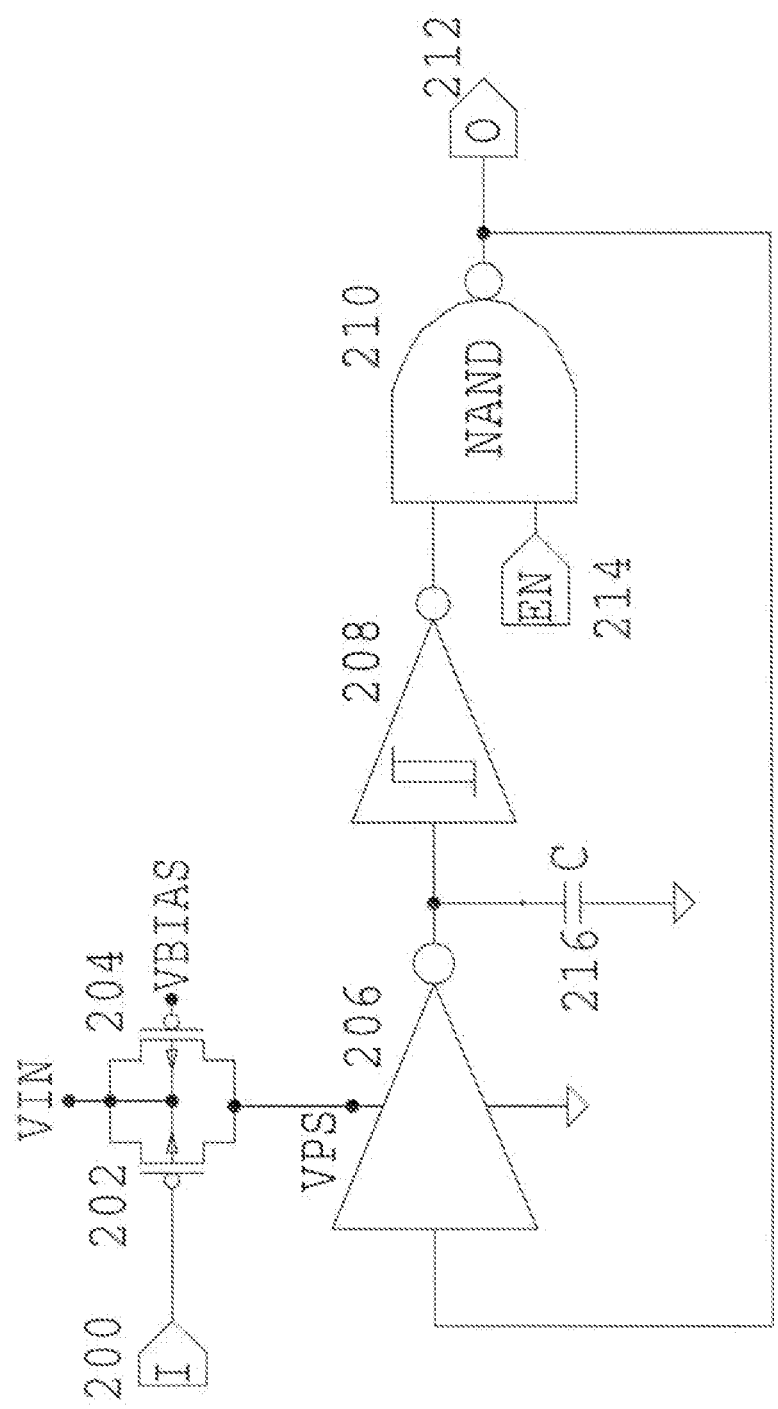
FIG. 2 illustrates a circuit diagram for a VCO of a load switch system of the present invention.

FIG. 2 illustrates a circuit diagram for a VCO of a load switch system of the present invention. A VCO can be connected to vary inversely with an input voltage. In this example, the VCO is a ring oscillator designed to have a frequency which continuously varies inversely with the voltage at an input port 200. A PMOS 202 and another PMOS 204 form a current source that supplies current to a node VPS of an inverter 206. The source of PMOS 202 and the source of PMOS 204 connect to the input voltage VIN. Here, the PMOS 204 supplies a fixed current determined by the constant bias input VBIAS, while the PMOS 202 supplies a variable current inversely proportional to the voltage at the input port 200.

The inverter 206 can receive a controlled current source from the node VPS in such a way that when the input of the inverter 206 is low, the current supplied at the node VPS can charge a capacitor 216 at the output of inverter 206.

In this way, the frequency of the ring oscillator depends upon the amount of current delivered at the node VPS and the value of the capacitor 216. In this example, the frequency of oscillation can also depend upon the optional hysteresis of an inverter 208, which receives an input voltage from the output of the inverter 206. The third stage of the ring oscillator is a NAND gate 210 allowing the ring oscillator to have an enable pin 214. The output of the ring oscillator is an output signal 212 which has a frequency inversely proportional to the voltage at the input port I.

When the VCO is viewed within the context of a load switch system of the present invention (e.g., the load switch system illustrated in FIG. 1), the VCO can provide a maximum frequency when the input 1200 (illustrated in FIG. 2) is low due to the output voltage OUT (illustrated in FIG. 1) being low. When the output voltage OUT (illustrated in FIG. 1) is high, then the input 1200 (illustrated FIG. 2) transitions high to a value close to the input voltage VIN.

Referring to FIG. 2, the net current available to drive the capacitor C 216 is reduced; this can decrease the frequency. In this design, the frequency can vary continuously and inversely with the voltage at the input 1200 until the gate of the PMOS 202 reaches near a threshold. The PMOS 204 provides a fixed current depending upon the value of the gate bias VBIAS to allow for a fixed frequency once the input 1200 is high. Once the output voltage OUT (illustrated in FIG. 1) attains a high value, the oscillator frequency is reduced to a low steady-state value. This in turn further reduces the quiescent loss due to switching. Notice that when the enable EN 214 is low, the oscillator is disabled. A designer can have the freedom to select sizes for the PMOS 202 and the PMOS 204 appropriate to a particular application's specification. Also, the designer can select the value of the capacitor C 216.

Figure 3:
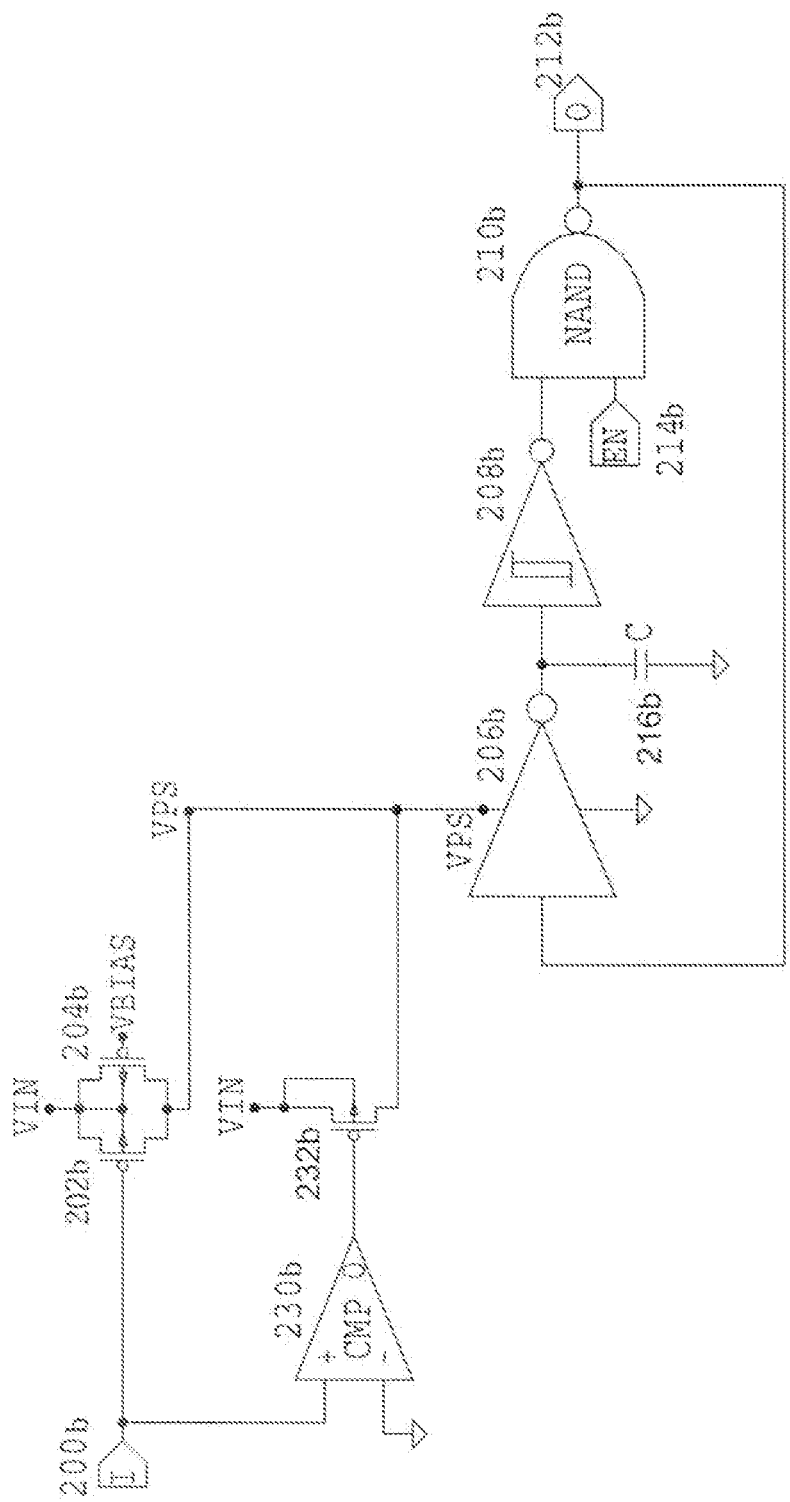
FIG. 3 illustrates a circuit diagram for a modified VCO of a load switch system of the present invention.

FIG. 3 illustrates a circuit diagram for a modified VCO of a load switch system of the present invention. A modified VCO can allow for an abrupt step decrease in frequency in addition to the gradual decrease in frequency as a function of the voltage at an input port 200b. Here, an additional PMOS 232b is connected between the input voltage VIN and VPS in such a way that its gate voltage can abruptly change from low to high when the input port 200b rises above ground. By design, the PMOS 232b conducts current when the voltage at the input port 200b is at ground, and blocks current when voltage at the input port 200b is slightly above ground.

The modified VCO allows for an independent step in frequency. When the input port 200b exceeds a voltage slightly above ground, the frequency can be reduced to a value determined by a PMOS 202b and a PMOS 204b. When the input port 200b is at ground, the PMOS 232b can allow the frequency to be high such that a turn-on delay time is significantly reduced. Once the PMOS 232b is turned off, the frequency can be reduced to prevent excessive inrush current. Inrush current can be defined as the current flowing from the port having the output voltage OUT into an external capacitive load. A designer has the freedom to select sizes for the PMOS 202b, the PMOS 204b, and the PMOS 232b appropriate to a particular application's specification. Also, the designer can select the value of a capacitor C 216b. By design, the trip point of a comparator ("CMP") 230b is typically within a few millivolts above ground. In general, the requisite trip point can depend upon the level necessary to prevent excessive inrush current.

Figure 4:
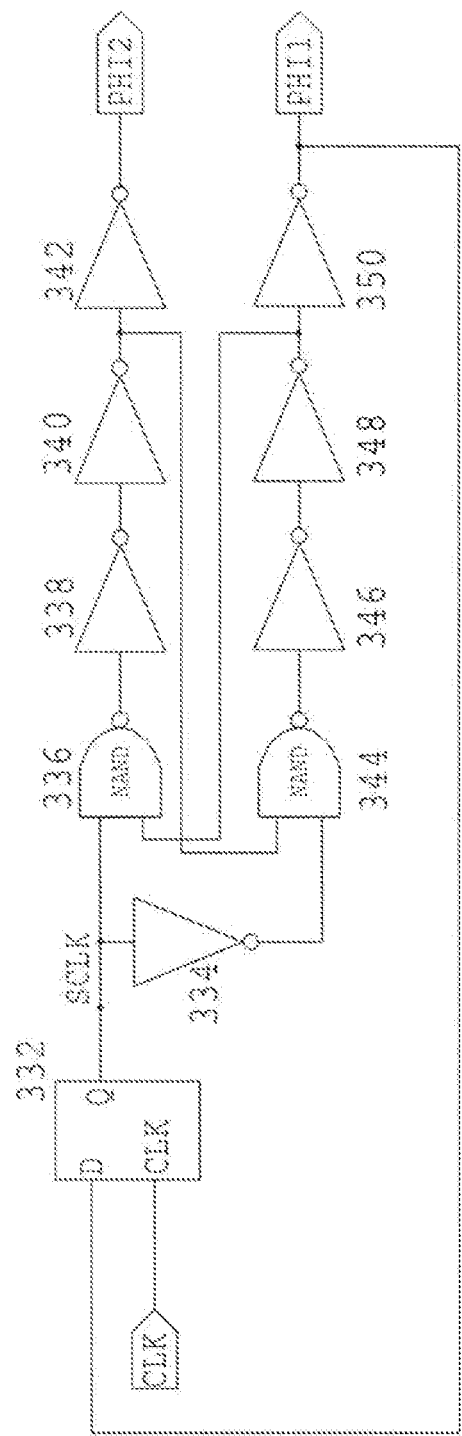
FIG. 4 illustrates a circuit design for generating buffered signals PHI1 and PHI2 for a load switch system of the present invention.

FIG. 4 illustrates a circuit design for generating buffered signals PHI1 and PHI2 for a load switch system of the present invention. Buffered signals PHI1 and PHI2 can be non-overlapping clock signals generated from a clock signal CLK. In this example, a D-flip-flop 332 is used with the non-overlapping clock buffers to allow nearly fifty percent duty cycle for a clock signal SCLK. The non-overlapping clocks are generated using the gates and inverters 334-350. The buffering can be limited to four stages per channel. However, any number of inverter stages may be used in order to drive the capacitance associated with the charge pump switch array block.

With respect to a design approach to creating the non-overlapping symmetric phases PHI1 and PHI2 for the charge pump, a circuit designer has the freedom to use more or fewer inverters for buffering. The design should allow enough buffering so that the phases PHI1 and PHI2 may drive the net charge-pump capacitances at the minimum the input voltage VIN value under worst-case process conditions over temperature. A person having ordinary skill in integrated circuit design should be familiar with these sizing techniques. Moreover, as mentioned with reference to FIG. 1, the circuit designer can use the input voltage VIN as the supply voltage. Also, the techniques for buffering and for sizing inverters should be common knowledge to the circuit designer.

Figure 5:
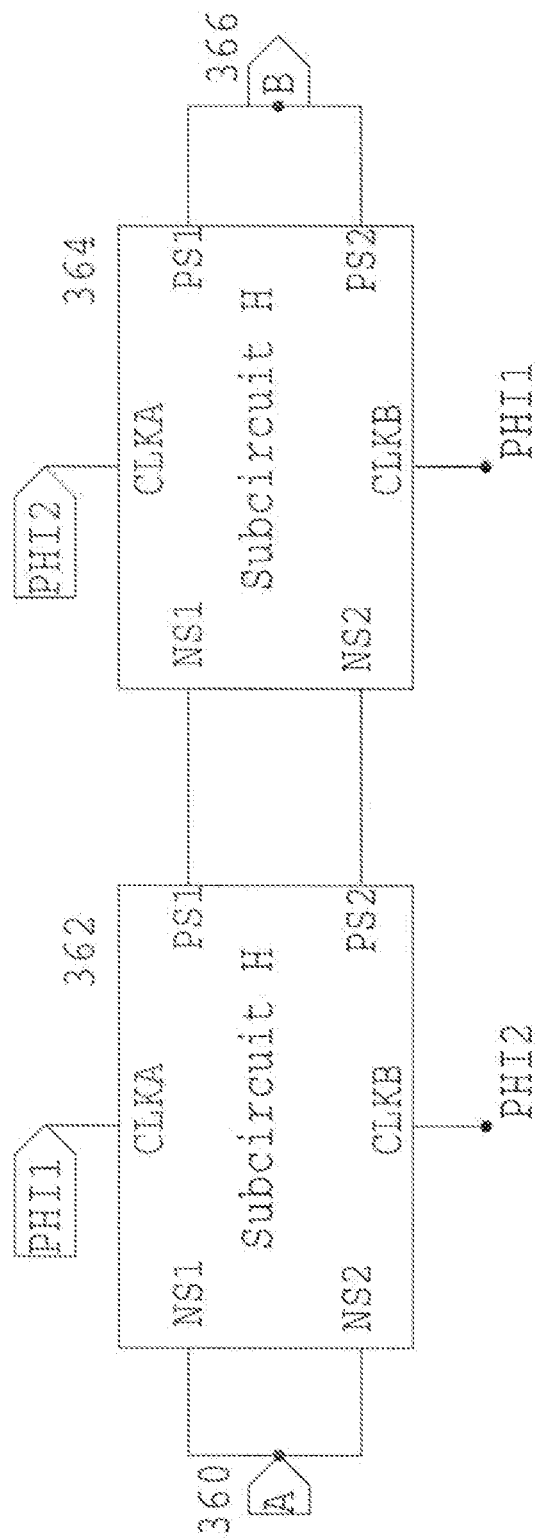
FIG. 5 illustrates a block diagram of a charge pump switch array for a load switch system of the present invention.

FIG. 5 illustrates a block diagram of a charge pump switch array for a load switch system of the present invention. A dual branch sub-circuit H array, as detailed in the non-provisional patent application having Ser. No. 12/854,777 filed on Aug. 11, 2010, entitled "Methods and Circuits for a Low Input Voltage Charge Pump" (incorporated here by reference), can be an example of a charge pump that can be used in conjunction of the present invention. This type of charge pump is suitable because phases PHI1 and PHI2 can force positive charge to flow from port A 360 (the left most port) to port B 366 (the rightmost port) with negligible switch voltage loss.

It is understood that this is one of many examples of a suitable charge-pump array for a load switch system of the present invention. With respect to the charge pump topologies available, this topology allows a circuit designer to design a charge pump, which can attain values close to a multiple of the input voltage VIN, with minimal switch loss. Therefore, in theory, it is possible to attain an integer value of the input voltage VIN at the charge pump output. In addition, this type of charge pump array can operate at very low values of the input voltage VIN.

Figure 6:
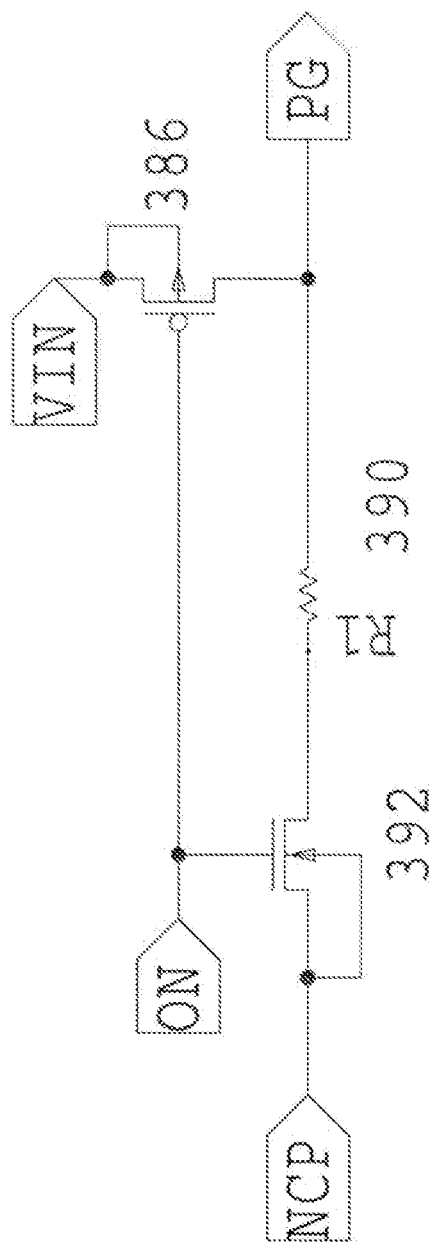
FIG. 6 illustrates a circuit diagram for a filter and gate control block of a load switch system of the present invention.

FIG. 6 illustrates a circuit diagram for a filter and gate control block of a load switch system of the present invention. A charge pump voltage NCP is applied to a body-connected source of an NMOS 392. The gate of the NMOS 392 receives the input signal ON, and the drain of the NMOS 392 connects to one end of an optional slew resistor 390. The other end of the slew resistor 390 connects to the gate voltage PG. A PMOS 386 is gated by the input signal ON. The body-connected source of the PMOS 386 is connected to the input voltage VIN and its drain is connected to the gate voltage PG. The circuit can filter and control the gate voltage PG of the load switch system of the present invention.

When the input signal ON is high and equal to the input voltage VIN, the PMOS 386 can be off (e.g., blocking charge). During this period, as the negative charge pump voltage NCP is driven low, the gate voltage PG can begin to fall after the NMOS 392 turns on. The combination of the NMOS 392 and the resistor 390 are part of a low-pass filter. The low-pass filter consists of the gate capacitance of a P-channel load switch (not shown, but an example of which is given by the P-channel load switch 110 illustrated in FIG. 1) combined with the NMOS 392 and the resistor R1 390.

The slew rate can be determined by the rate of charge flow due to the voltage NCP and the time constant of the gate capacitance with the resistor R1 390. If slew rate is not of concern and if the charge pump does not allow for reverse charge flow when the charge pump turns off, then in theory, the NMOS 392 and the resistor R1 390 can become optional. Note, when the input signal ON transitions from high to ground, the NMOS 392 is off and blocks charge while the PMOS 386 conducts so as to drive the gate voltage PG high. This in turn can turn off the P-channel load switch.

Figure 7:
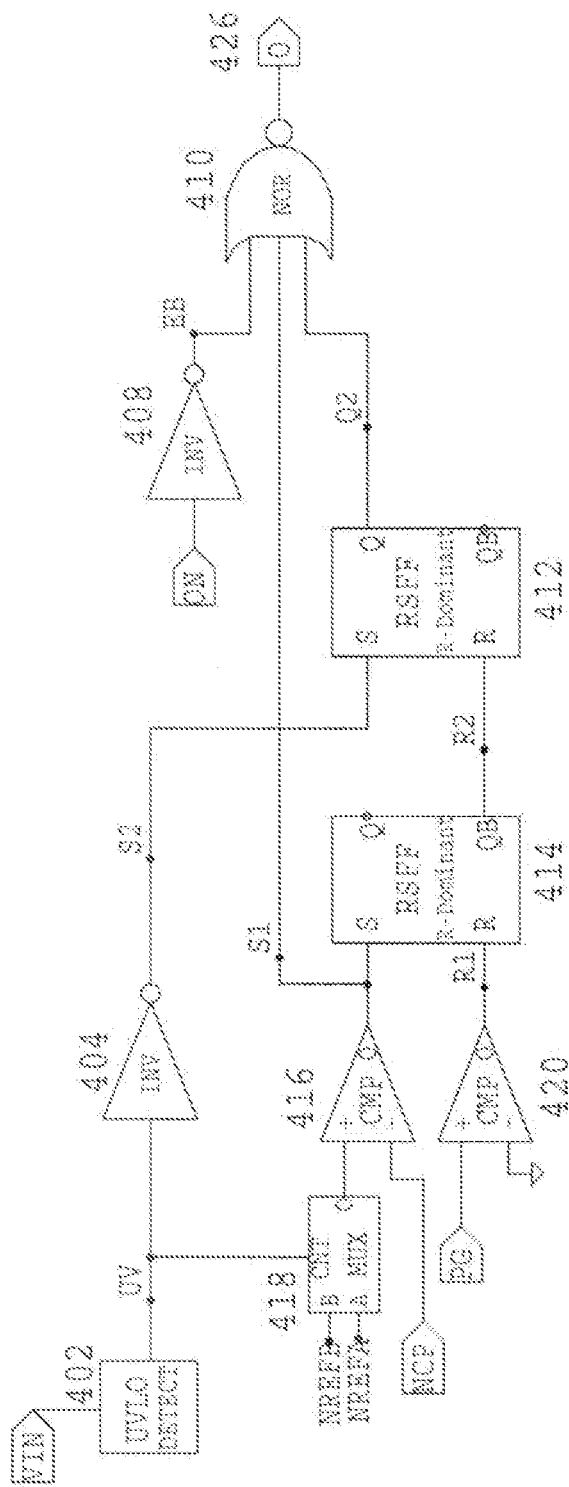
FIG. 7 illustrates a block diagram for a VCO logic circuit of a load switch system of the present invention.

FIG. 7 illustrates a block diagram for a VCO logic circuit of a load switch system of the present invention. A VCO logic circuit can comprise the following: an under voltage detector circuit ("UVLO detector") 402, a multiplexer ("MUX") 418, comparators 416 and 420, reset-dominant SR flip-flops ("RS-FFs") 412 and 414, inverters 404 and 408, and a three-input NOR gate 410. The input ports of the VCO logic circuit are as follows: an input voltage VIN, a negative charge pump voltage NCP, a P-channel gate voltage PG, and an input signal ON for enabling and disabling the system. The output is a logic level at the output 426 of the NOR gate 410.

The input of the UVLO detector 402 controls an output signal UV which in turn drives the inverter 404 and the control logic level of the multiplexer 418. The comparator 416 receives a reference signal, at its non-inverting node, from the output of the multiplexer 418. The reference signal to the multiplexer 418 is either NREFB or NREFA depending upon the logic level of the signal UV at an input CNT of the multiplexer 418.

The comparator 416 compares the voltage NCP to its reference and provides an output voltage S1, which in turn directly drives one input of the NOR gate 410 and the set input of the RSFF 414. The comparator 420 compares the P-channel gate voltage PG to ground and outputs a reset signal R1 to the RSFF 414, where RSFF refers to an RS flip-flop. The output of the inverter 404 is the set voltage S2 for the RSFF 412, while the inverted output ("QB") of the RSFF 414 is the reset signal for RSFF 412. The non-inverting output ("Q") of RSFF 412 drives one input of the NOR gate 410. The third input of the NOR gate 410 is driven by an output signal EB generated from the inverter 408.

The UVLO detector block 402 is designed to output a high voltage for the signal UV when the value of the input voltage VIN is too low to drive a gate of a P-channel load switch (e.g., the P-channel load switch 110 illustrated in FIG. 1). Note that the output 426 of the VCO logic block can enable or disable a VCO (e.g., the VCO 102 illustrated in FIG. 1). When the output 426 of the VCO logic block is low, the VCO 102 is off to prevent charge-pump operation. The NOR gate 426 can be low if one of the following occurs: the output signal EB from the inverter 408 is high; a voltage S1 is high; and a voltage Q2 is high. The voltage S1 is the voltage output of the voltage comparator 416. The comparator 416 compares the voltage NCP to a negative reference derived from the output of the multiplexer 418. The multiplexer 418, the negative references NREFB and NREFA, and the comparator 416 are combined in a succinct design illustrated in FIG. 8. If the signal UV from the UVLO detector block 402 is high, then the multiplexer 418 can select a larger magnitude negative value from NREFA.

In addition, the multiplexor 418 is optional and can be omitted if this degree-of-freedom is unnecessary. If omitted, then a fixed negative reference can be connected to the non-inverting input of the comparator 416. This degree-of-freedom, including the multiplexer 418, allows for the protection of the gate of the P-channel load switch (e.g., the P-channel load switch 110 illustrated in FIG. 1) when the input voltage VIN reaches large values.

Furthermore, the output of the comparator 416 drives both the voltage S1 and the set input of RSFF 414. The output of the comparator 420 drives node R1 and can guarantee that RSFF 414 is in the reset state with Q output low until the gate voltage PG falls below ground. The RSFF 414 can reach a set state with Q output high, once the voltage NCP falls below the negative reference set by the multiplexer 418. Thus, the gate of the P-channel load switch (e.g., the P-channel load switch 110 illustrated in FIG. 1) can always be pulled low, to a well-defined value less than ground, using the negative charge pump.

When the signal UV is low, the voltage S2 of the inverter 404 is high. Under this condition, the output voltage Q2 of RSFF 412 is able to transition high after R2, the QB node of RSFF 414, transitions low. As discussed above, this can happen after the gate voltage PG has fallen below ground and the voltage NCP has fallen below the negative reference.

Based on the previous description, a person having ordinary skill in circuit designer can understand that the voltage S1 can control the logic output with a time-constant related to the hysteresis of the load switch system (illustrated in FIG. 1). Thus, the oscillator is enabled and disabled with a time constant relating to the delay in the load switch system. Additional, hysteresis information can be added to the comparator 416 if the system delay does not provide enough hysteresis. The voltage S1 can regulate the gate voltage PG from the P-channel load switch when the signal UV is high. When the signal UV is low, it is the output voltage Q2 that can force the output 426 low so as to latch the oscillator off. In this case, when the signal UV is low, the output voltage Q2 can remain high in a latched state until the gate voltage PG transitions above ground. It is noted that one mechanism for the gate voltage PG to transition above ground is due to leakage current.

Figure 8:
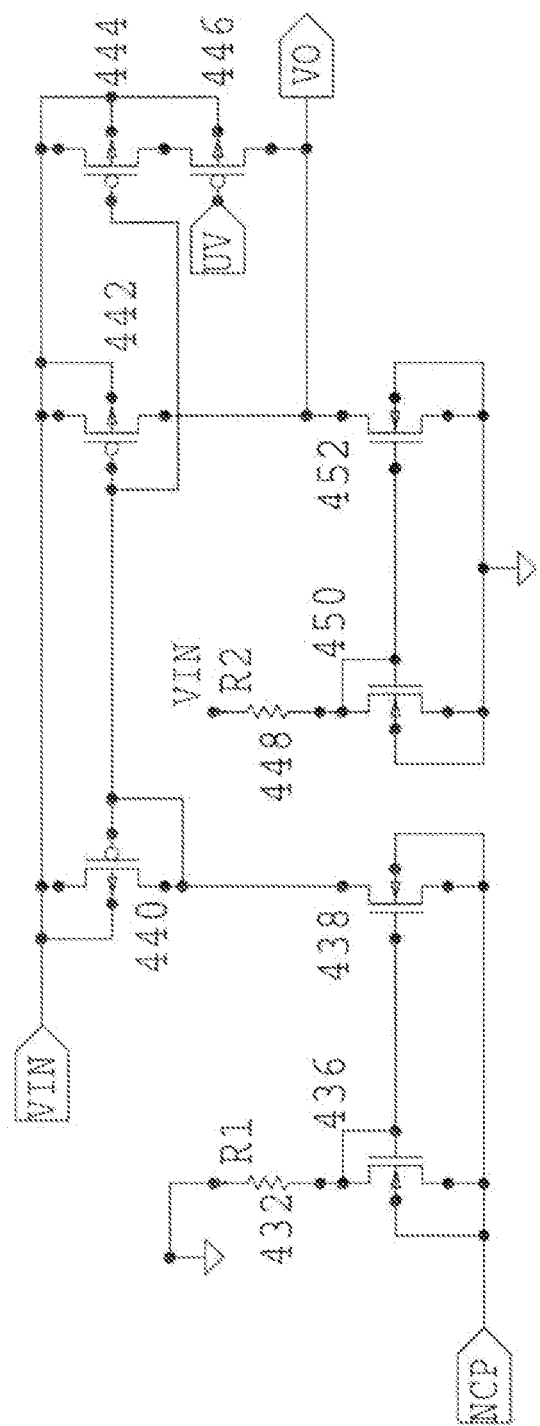
FIG. 8 illustrates a transistor-level diagram for implementing a comparator and a multiplexer of a load switch system of the present invention.

FIG. 8 illustrates a transistor-level diagram for implementing a comparator and a multiplexer of a load switch system of the present invention (e.g., the comparator 416 and the multiplexer 418 illustrated in FIG. 7). This succinct approach uses a resistor R1 432 which is connected between ground and a diode-connected NMOS 436. Note that diode-connected can mean a gate and drain connected together.

The NMOS 436 has its body-connected source tied to a negative charge pump voltage NCP. An NMOS 438 forms a current-mirror circuit with the NMOS 436. A diode-connected PMOS 440 connects to the drain of the NMOS 438, and the PMOS 440 and a PMOS 442 form another current mirror with the body-connected source side tied to the input voltage VIN. A resistor R2 448 is connected between the input voltage VIN and a diode-connected NMOS 450. The NMOS 450 has its body-connected source tied to ground, and the NMOS 450 and a NMOS 452 form a current mirror. A port having an output voltage VO is connected at the drain of PMOS 442 and at the drain of the NMOS 452. Finally, the signal UV controls the PMOS 446 which has its drain also connected to the voltage VO. The PMOS 444 forms either a current multiplier or a current mirror with the PMOS 440.

Thereby, the voltage NCP can be succinctly compared to a negative multiple of the input voltage VIN. When the signal UV is high, the output voltage VO can transition to high when the drain current in the PMOS 442 exceeds that in the NMOS 452. This trip point can be tailored to be independent of the gate-to-source voltages ("VGS") of the NMOS 436 and the NMOS 450 by designing the ratio of the resistors R1 432 and R2 448 to be equal to the ratio of the voltage VGS of the NMOS 436 to the voltage VGS of the NMOS 450. When the signal UV is low, the additional PMOS 444 determines a different condition for a transition. The PMOS 446 is designed as a switch. Additionally, the PMOS 444 is designed as a mirror or a multiplier to the PMOS 440. If the PMOS 444 is significantly larger than the PMOS 442, then the new condition for transition approaches that of the voltage NCP equal to the NMOS 436 threshold below ground.

An important aspect of this design is that there is a path to ground through the NMOS 436 and the resistor R1 432. This branch and the current in this branch determine the regulation time constant relating to a voltage S1 (illustrated in FIG. 7). In addition, when the signal UV is low and an output voltage Q2 (illustrated in FIG. 7) latches, this branch limits the gate voltage PG to a maximum value of ground. This would not be the case if the high-potential node of the resistor R1 432 was a voltage potential higher than ground.

Figure 9:
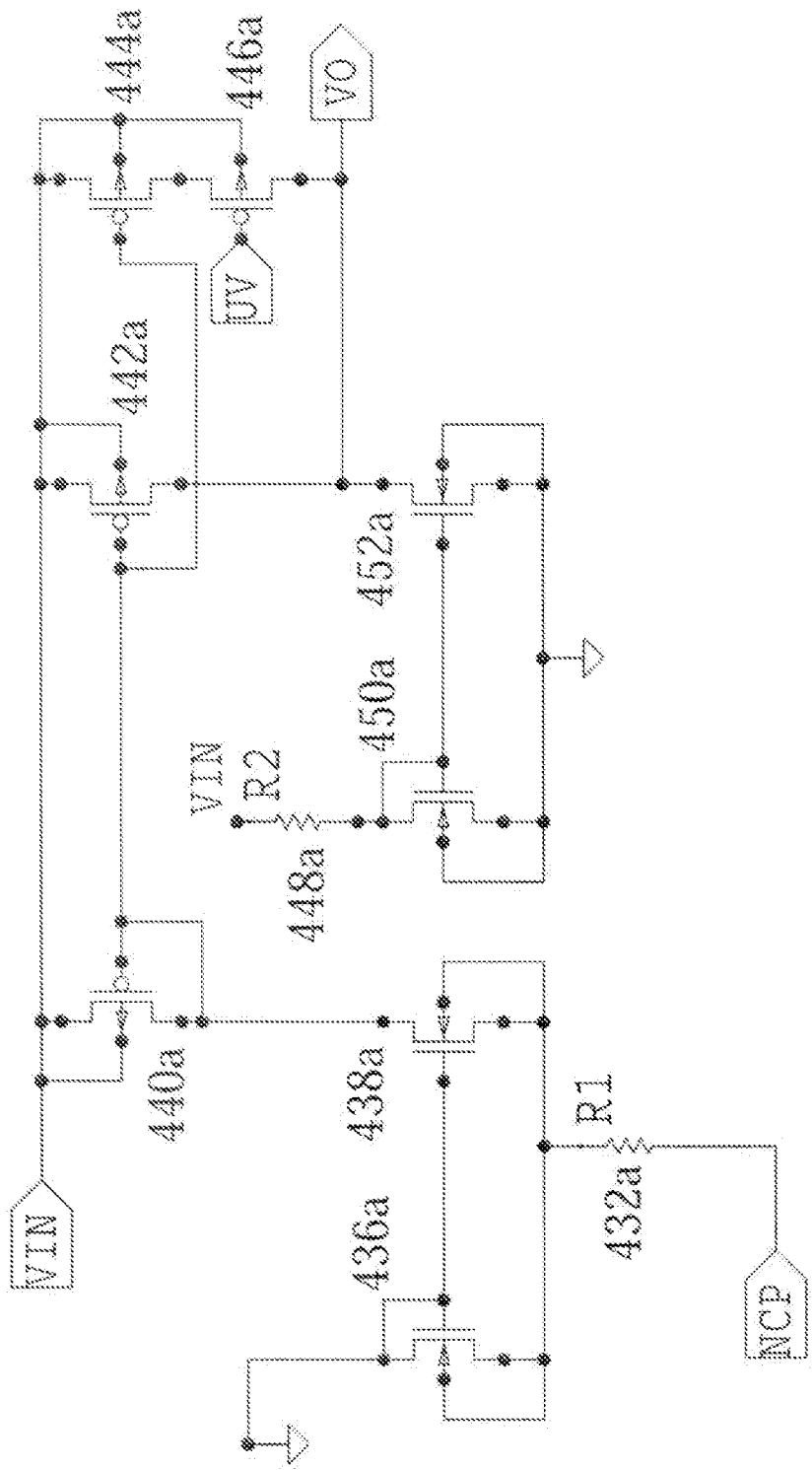
FIG. 9 illustrates another transistor-level diagram for implementing a comparator and a multiplexer of a load switch system of the present invention.

FIG. 9 illustrates another transistor-level diagram for implementing a comparator and a multiplexer of a load switch system of the present invention (e.g., the comparator 416 and the multiplexer 418 illustrated in FIG. 7). This circuit approach is similar to the circuit illustrated in FIG. 8, except the resistor R1 432a is connected between the voltage NCP and the body-connected source of the NMOS 436a. Also, the diode-connected drain of the NMOS 436a is now connected directly to ground. Notice that the NMOS 436a with the NMOS 438a still form a current mirror, and the remaining components are connected in the same manner as illustrated in FIG. 8.

In this embodiment, since current flows into the resistor R1 432a from the sources of both the NMOS 438a and the NMOS 436a, a new relationship is derived for the transition condition of the output voltage VO. An advantage of this technique is that it can offer over-voltage stress protection for the NMOS 436a and the NMOS 438a.

Figure 10:
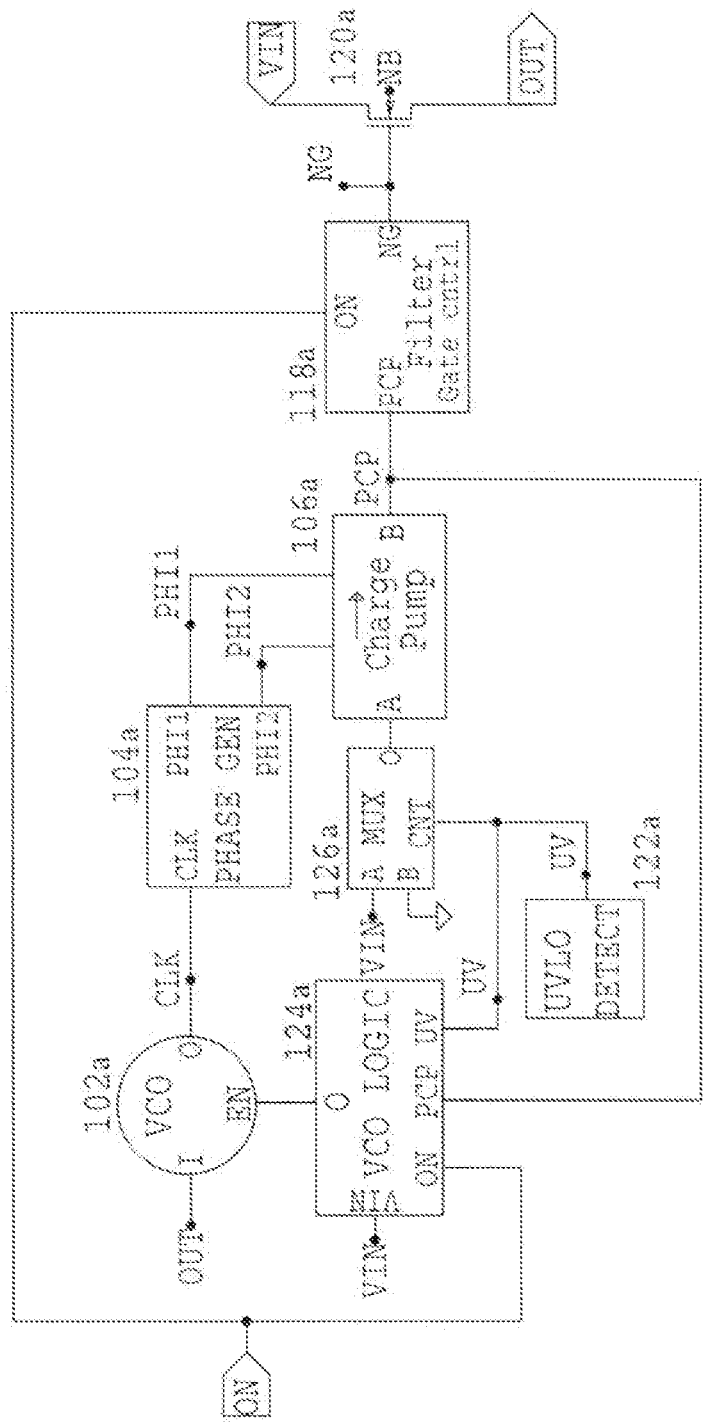
FIG. 10 illustrates an N-channel load switch system of the present invention.

FIG. 10 illustrates an N-channel load switch system of the present invention. An N-channel load switch system of the present invention comprises an N-channel MOSFET 120a having a source connected to a port having an output voltage OUT, a drain connected to an input voltage VIN, and a gate having a gate voltage NG. The body of MOSFET 120a may be connected to its source or it may be connected to the lowest potential ground. This system is controlled by an input signal ON. The main blocks of this system are a VCO 102a, a VCO logic block 124a, a phase generator 104a, a charge pump 106a, a multiplexer 126a, an under-voltage detector circuit 122a, a filter and gate control block 118a.

These blocks are connected to form a closed-loop system to control the gate of the N-channel MOSFET 120a. The VCO 102a is designed to output the clock signal CLK. The VCO control voltage is connected to the output voltage OUT. The VCO enable pin is connected to the output of the VCO logic block 124a. The VCO logic block's 124a inputs are the input signal ON, the gate voltage NG, a positive charge pump voltage PCP, an under-voltage signal UV, and the input voltage VIN. The under-voltage signal UV is determined by the condition that the input voltage VIN is less than a specified under-voltage level or reference.

The phase generator 104a generates phase signals PHI1 and PHI2 for the charge pump 106a. The charge pump 106a generates the positive voltage PCP at port B referenced to the voltage level at port A. The multiplexer 126a, in turn, sets the level at port A of the charge pump 106a based upon an input CNT, which is either high or low depending upon the value of UV from the UVLO 122a. The multiplexer 126a allows either the input voltage VIN (at its input port A) or the ground voltage (at its input port B) to pass to port A of the charge pump 106a. The filter and gate control block 118a controls the gate voltage NG and can have the following as inputs: the voltage PCP and the input signal ON.

An optimal drive is provided to the gate of the N-channel load switch 120a. The gate drive to the N-channel load switch 120a can be a positive-regulated gate voltage NG. In this system, the positive charge pump 106a delivers the voltage PCP greater than the input voltage VIN in order to drive the gate voltage high enough for load-switch operation. The purpose of the VCO logic block 124a is to control the enabling and disabling of the VCO 102a. The VCO 102a is designed to reduce its frequency once the output reaches its desired level. In this way, overall switching loss can be minimized.

The filter and gate control block 118a serves as a filter between the positive charge pump output PCP and the gate of the load switch 120a; it also can provide turnoff control. An optional under-voltage detector 122a can be included to allow the charge pump to deliver more voltage when the input voltage VIN is less than the under-voltage threshold. This is especially important at higher voltages since overvoltage stress on the gate becomes a concern.

The output signal UV of the UVLO detector 122a can be inputted to the VCO logic block 124a and the multiplexer 126a. When the input voltage VIN is less than the under-voltage trip voltage, the output signal UV is high. In this case, the multiplexer 126a can provide the input voltage VIN at input A to the charge-pump array 106a. When the output signal UV is low, the multiplexer 126a can provide ground to the input A. This same function can also be accomplished with a couple of inverters replacing multiplexer 126a. The design goal is to allow the charge pump to pump and to be regulated to the maximum charge pump value available.

A person having ordinary skill in the art related to integrated circuit design can appreciate there are elements, such as ESD, which may need to be added to the design and the layout may need to use process relevant techniques. Also, there are global nodes such as the input voltage VIN, ground, and substrate, which are not drawn for each block. The input signal ON controls the charge pump and gate drive.

Here, when the input signal ON transitions from low to high, the gate voltage NG is pulled from ground to a value greater than the input voltage VIN through the positive charge pump. Also, when the input signal ON transitions from high to low, the positive charge pump turns off and the gate voltage NG is pulled low to ground so as to turn off the N-channel load switch 120a. Although not presented here, the input logic can also be reversed so that, when the input signal ON is low, the N-channel load switch 120a turns on.

Figure 11:
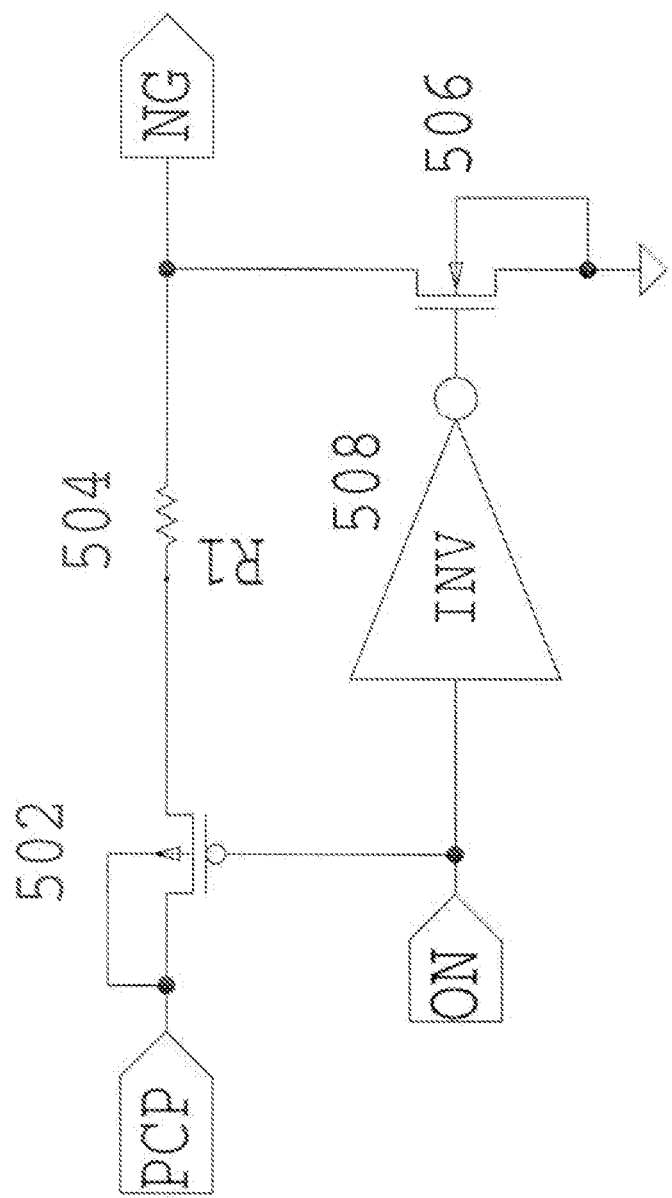
FIG. 11 illustrates a circuit diagram for a filter and gate control block of an N-channel load switch system of the present invention.

FIG. 11 illustrates a circuit diagram for a filter and gate control block of an N-channel load switch system of the present invention. A positive charge pump voltage PCP is applied to the body-connected source side of a PMOS 502. An input of an inverter 508 receives an input signal ON. The output of the inverter 508 connects to a gate of an NMOS 506. The body-connected source of the NMOS 506 is connected to ground, and the drain of the NMOS 506 is connected to a gate voltage NG. A slew resistor R1 504 is connected to the gate voltage NG at one end and the drain of the PMOS 502 on the other end.

Note the filter and gate control block can be used in place of the control filter 118 (illustrated in FIG. 10). By design, when the input signal ON is high and equal to the input voltage VIN, the NMOS 506 can be off (e.g., blocking charge). During the transient period, the voltage PCP is driven high and the gate voltage NG begins to rise at a rate determined by a threshold of the PMOS 502 and the resistor R1 504. One advantage of using the PMOS 502 is that it can block charge from reaching the gate voltage NG until after the charge pump reaches a level above the voltage potential of the input signal ON. Since the input signal ON can equal the input voltage VIN, this means the charge pump attains an NMOS threshold above the input voltage VIN before charge may pass to a gate of an N-channel load switch (e.g., the gate of the N-channel load switch 120 illustrated in FIG. 10) having the gate voltage NG.

The low-pass filter consists of the gate capacitance of the N-channel load switch combined with the PMOS 502 and the resistor R1 504. If slew rate is not of concern, then in theory, the PMOS 502 and the resistor R1 504 become optional. Note that, when the input signal ON transitions from high to ground, the PMOS 502 allows the voltage PCP and the gate voltage NG to both pull to ground through the NMOS 506. The NMOS 506 is gated high by the inverter 508. When the gate voltage NG reaches ground, the N-channel load switch is off (e.g., blocking charge).

Figure 12:
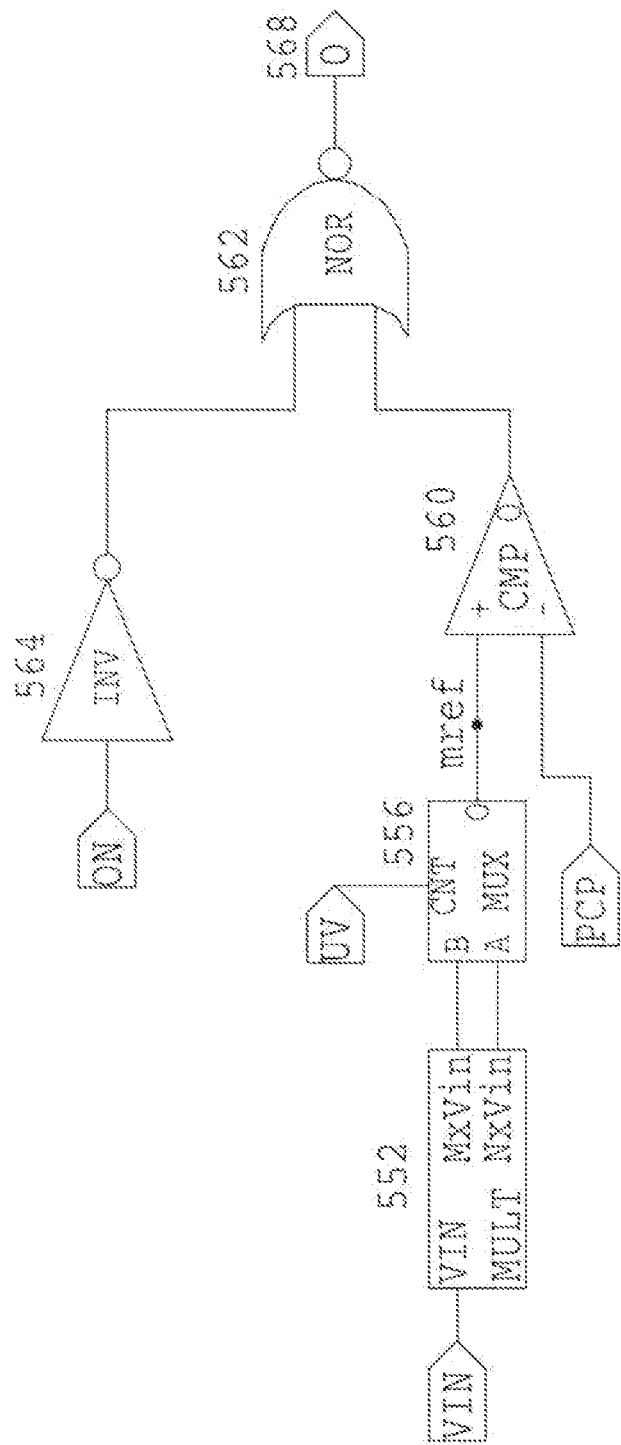
FIG. 12 illustrates an N-channel VCO logic circuit for a load switch system of the present invention.

FIG. 12 illustrates an N-channel VCO logic circuit for a load switch system of the present invention. An N-channel VCO logic circuit can comprise: a comparator 560, a multiplexer 556, a scalar multiplication block 552, an inverter 564, and a nor gate 562. The input ports are as follows: an input voltage VIN, a positive charge pump voltage PCP, a signal UV, and an input signal ON for enabling and disabling the system. The output of the N-channel VCO logic circuit is the logic level O 568 at the output of the NOR gate 562.

In this symbolic representation, the comparator compares the voltage PCP to an mref voltage, where the mref voltage is the output of the multiplexer 556. The inputs to the multiplexer 556 are derived from the scalar multiplication block 552. It is noted that this scalar multiplication is symbolic, and a practical circuit technique can be illustrated in FIG. 13. In addition, other circuit techniques can also be used for implementing the scalar multiplication.

The VCO logic circuit can be used for the VCO logic block 124 illustrated in FIG. 10. The output O 568 at the output of the NOR gate 562 can enable the VCO 102 illustrated in FIG. 10. This output depends upon the voltage potential of the input signal ON and upon the regulation condition. In this case, the regulation condition is determined by the signal UV, a symbolic multiple (either M or N times) of the input voltage VIN, and the level of the positive charge pump voltage PCP. The comparator 560 compares the positive charge pump voltage PCP to the node mref.

By design, mref is a multiple of the input voltage VIN corresponding to the maximum available charge pump output. For instance, if the output of the charge pump is three times the input voltage VIN, then the mref at the output of the multiplexer 556 can be selected to equal three times the input voltage VIN. System hysteresis or intentional hysteresis in the comparator 560 can assure regulation and a reduced average VCO frequency. This approach can optimally reduce quiescent current once the charge pump is running at its steady-state level.

Figure 13:
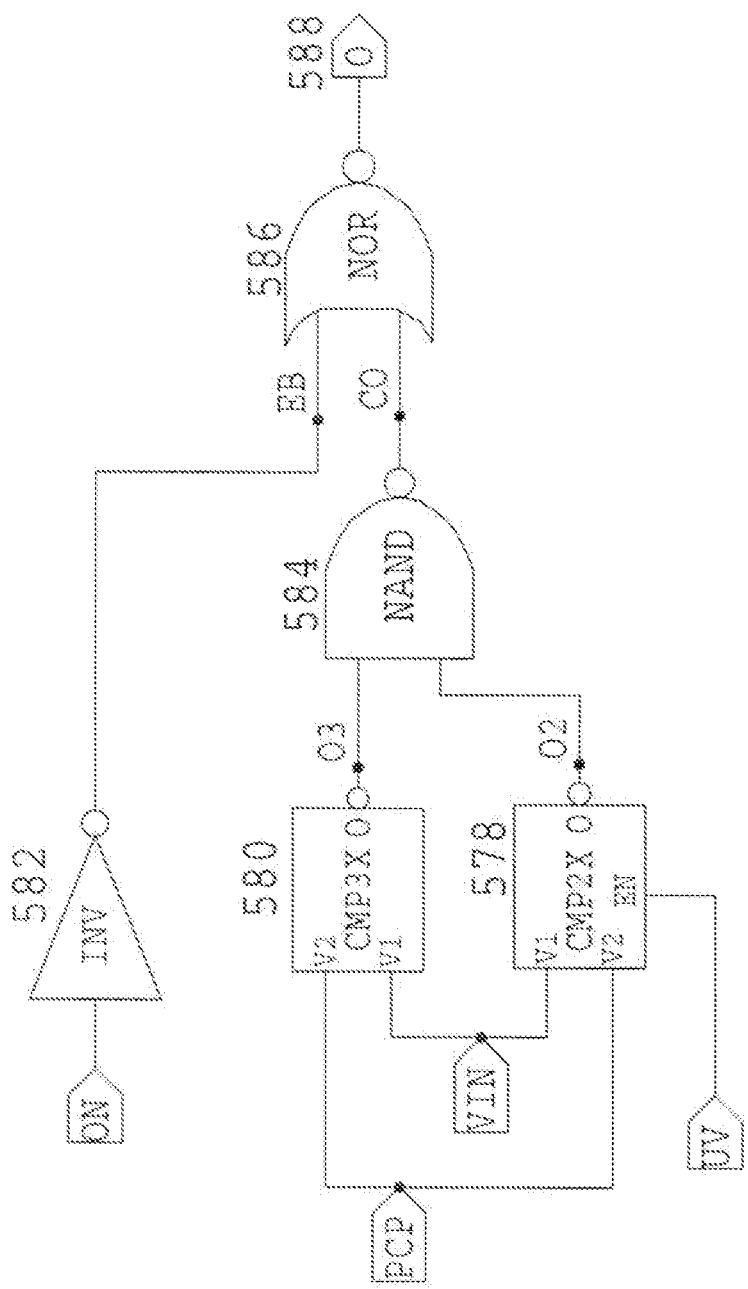
FIG. 13 illustrates another N-channel VCO logic circuit for a load switch system of the present invention.

FIG. 13 illustrates another N-channel VCO logic circuit for a load switch system of the present invention. An N-channel VCO logic circuit can comprise the following: an inverter 582, a nor gate 586, a nand gate 584, a comparator block CMP3X 580, and a comparator block CMP2X 578. The input ports are as follows: an input voltage VIN, a positive charge pump voltage PCP, a signal UV, and an input signal for enabling and disabling the system. The output is the logic level O 588 at the output of the NOR gate 586. In this circuit block representation, the comparator blocks CMP3X 580 and CMP2X 578 and the NAND gate 584 can be the circuit implementations of the blocks 552, 556, and 560 illustrated in FIG. 12. The VCO logic circuit can be used for the VCO logic block 124 illustrated in FIG. 10. In addition, the VCO logic circuit can be further realized using the circuit approaches in FIGS. 14-16.

Referring to FIG. 13, a multiple of the input voltage VIN level is used by the comparator blocks CMP3X 580 and CMP2X 578. For this particular design, a multiple of three times the input voltage VIN can regulate the output when the signal UV is high. Furthermore, a multiple of two times the input voltage VIN can regulate the output when the signal UV is low. This can be consistent with a charge pump array block (e.g., a charge pump array block illustrated in FIG. 5) to pump a multiple of three times the input voltage VIN when its input A is the input voltage VIN and to pump a multiple of two times the input voltage VIN when its input A is ground. In general, a circuit designer can match the multiplication scale factor of the regulation comparators with the selected charge pump array.

Figure 14:
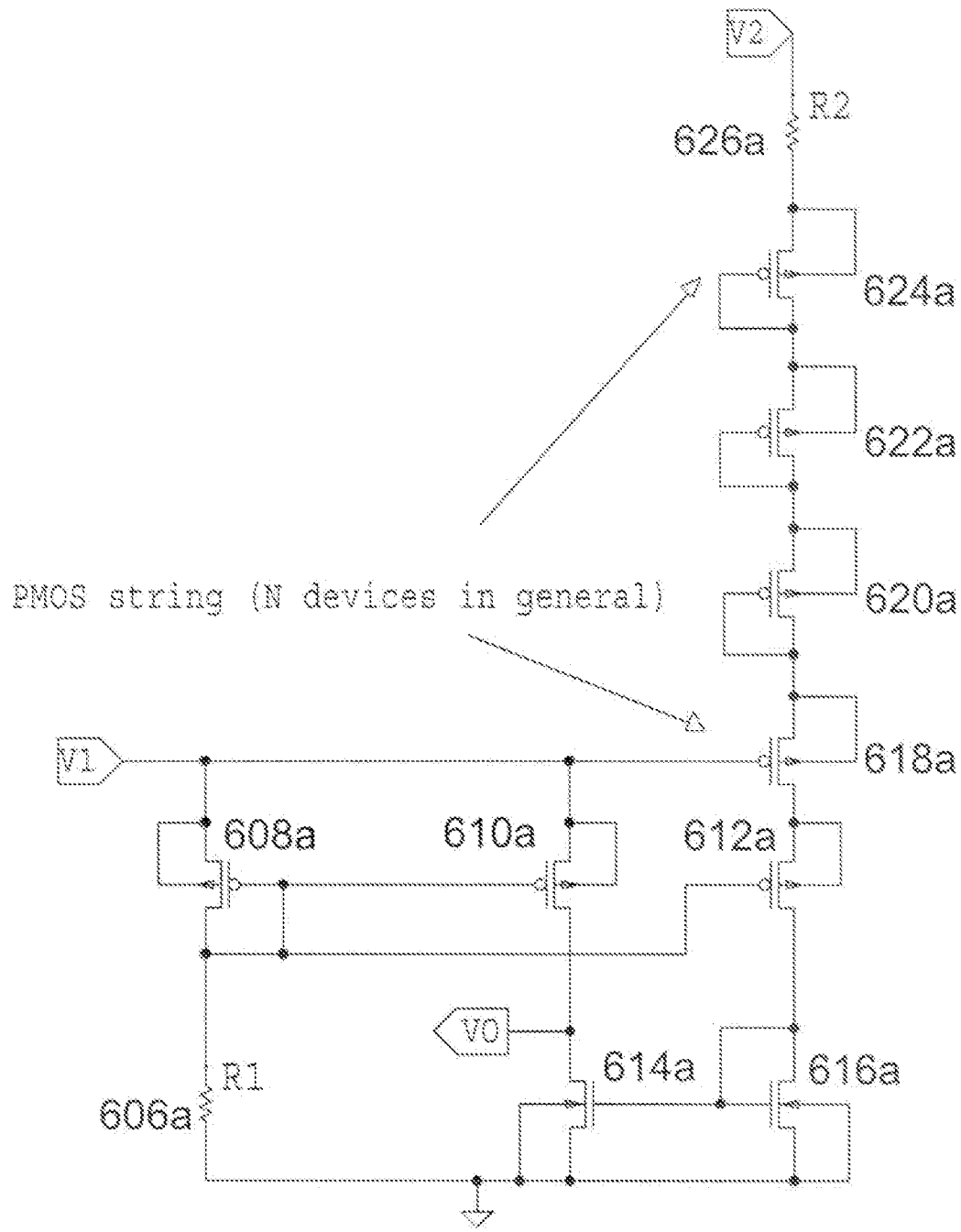
FIG. 14 illustrates a transistor-level implementation of a comparator block of the present invention for comparing a multiple of a voltage to another voltage.

FIG. 14 illustrates a transistor-level implementation of a comparator block of the present invention for comparing a multiple of a voltage to another voltage. The body-connected source of a PMOS 608a is connected to a voltage V1, while the gate and the drain of the PMOS 608a are connected to one end of a resistor R1 606a. The other end of the resistor R1 606a is connected to ground. The PMOS 608a and a PMOS 610a form a current mirror. The drain of the PMOS 610a connects to an output port having an output voltage VO. The body-connected source of an NMOS 616a is connected to ground, while the gate and the drain of the NMOS 616a are connected to the drain of a PMOS 612a. The NMOS 616a and an NMOS 614a form a current mirror. The drain of the NMOS 614a connects to the output port having the output voltage VO. The body-connected source of the PMOS 612a is connected to the drain of a PMOS 618a. The PMOS 612a is matched to the PMOS 610a and the PMOS 608a. The PMOS devices 618a, 620a, 622a, and 624a form a string of matched devices connected in series.

In general, any number, N, of PMOS devices may be connected in series in such a way as illustrated in FIG. 14. Each PMOS from the set of PMOS devices 618a, 620a, 622a, and 624a has its body connected to its respective source. The gate of the PMOS 618a is connected to the voltage V1. The body-connected source of the PMOS 619a is attached to the drain and gate of the PMOS 620a. The remaining PMOS devices 620a, 622a, and 624a are attached in series. The gate and drain of the PMOS 622a connects to the body-connected source of the PMOS 620a and so on until the final PMOS 624a. The body-connected source of the PMOS 624a connects to a resistor R2 626a. The other end of the resistor R2 626a connects to a voltage V2 602a. The output is the output voltage VO. In this way, the comparator block of the present invention can compare a multiple of the voltage V1 to the other voltage V2.

This design technique can be used for building a comparator with a trip-point of a multiple N times the voltage V1. There can be four drawn PMOS devices 618 through 624. If there are N drawn PMOS devices, then when the voltage V2 equals (N+1) times the voltage V1, the output voltage VO can transition low if the following conditions are met: the resistor R2 626 is matched to N times the resistor R1 606; the PMOS devices 608, 610, and 612 are matched devices of equal size; the NMOS 614 and NMOS 616 are also matched devices of equal size (to form a current mirror); and the N drawn PMOS devices (beginning with PMOS 618) are matched devices and equal in size to the PMOS 608.

The goal of the design is to cause the voltage VGS (the gate-source potentials) of the PMOS drawn devices (beginning with PMOS 618) to match that of the voltage VGS of the PMOS 608 at the trip-point condition. By doing so, and with the appropriate scaling of the resistors R2 and R1, the condition or trip-point for a transition of the output voltage VO can be independent of the voltage VGS and process parameters. This general technique for building a comparator is very convenient for the N-channel charge-pump system (illustrated in FIG. 10).

Figure 15:
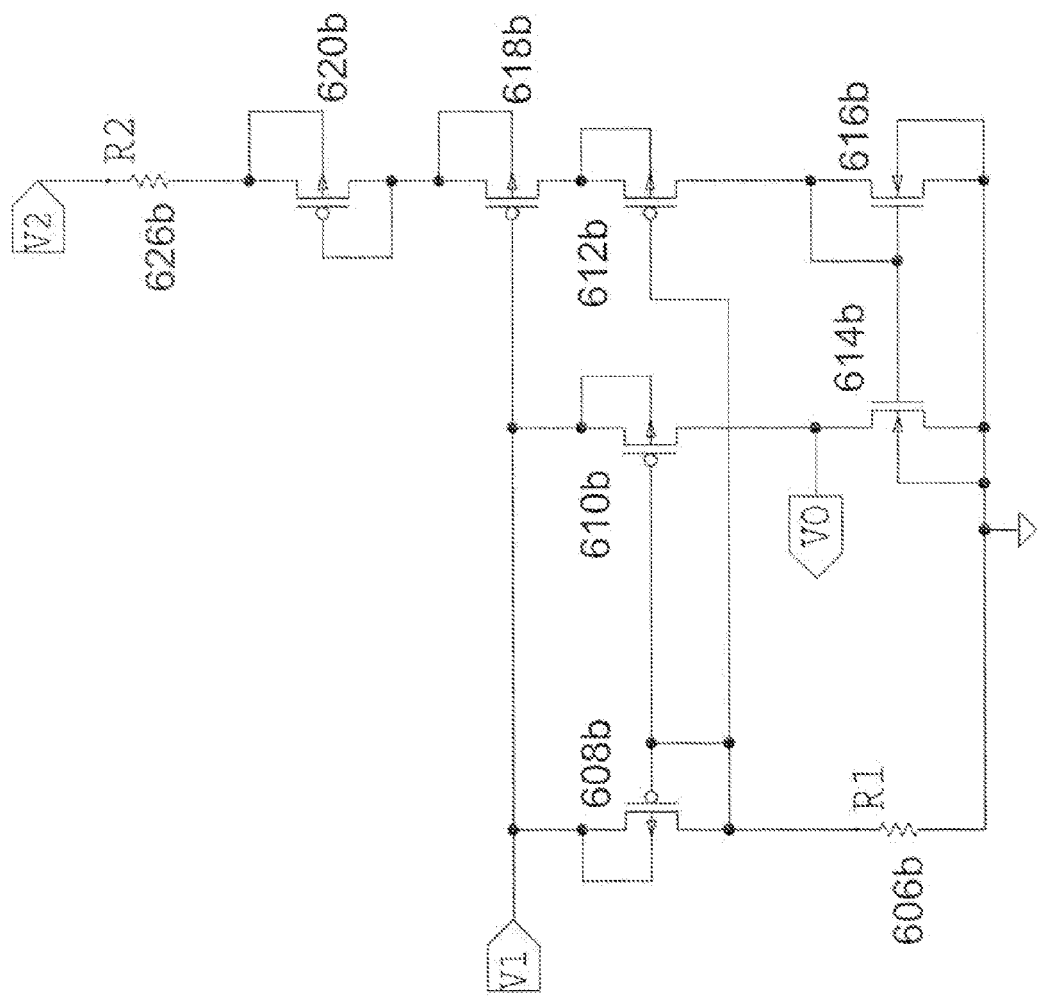
FIG. 15 illustrates another circuit implementation of a comparator of the present invention.

FIG. 15 illustrates another circuit implementation of a comparator of the present invention (e.g., the comparator CMP3X 580 illustrated in FIG. 13). A PMOS string of matched devices, including PMOS devices 618b, 620b, 608b, 610b, and 612b, NMOS devices 614b and 616b, and a resistor R1 606b can be connected in a similar circuit approach as that illustrated in FIG. 14. Referring to FIG. 15, the body-connected source of the final PMOS 620b can connect to a resistor R2 626b. The other end of the resistor R2 connects to a voltage V2. The output is an output voltage VO. The trip point is determined by the condition that the voltage V2 equals three times the voltage V1. Here, the voltage V1 connects to the input voltage VIN. Furthermore, the charge-pump voltage PCP (illustrated in FIG. 13) can connect to the voltage V2.

Figure 16:
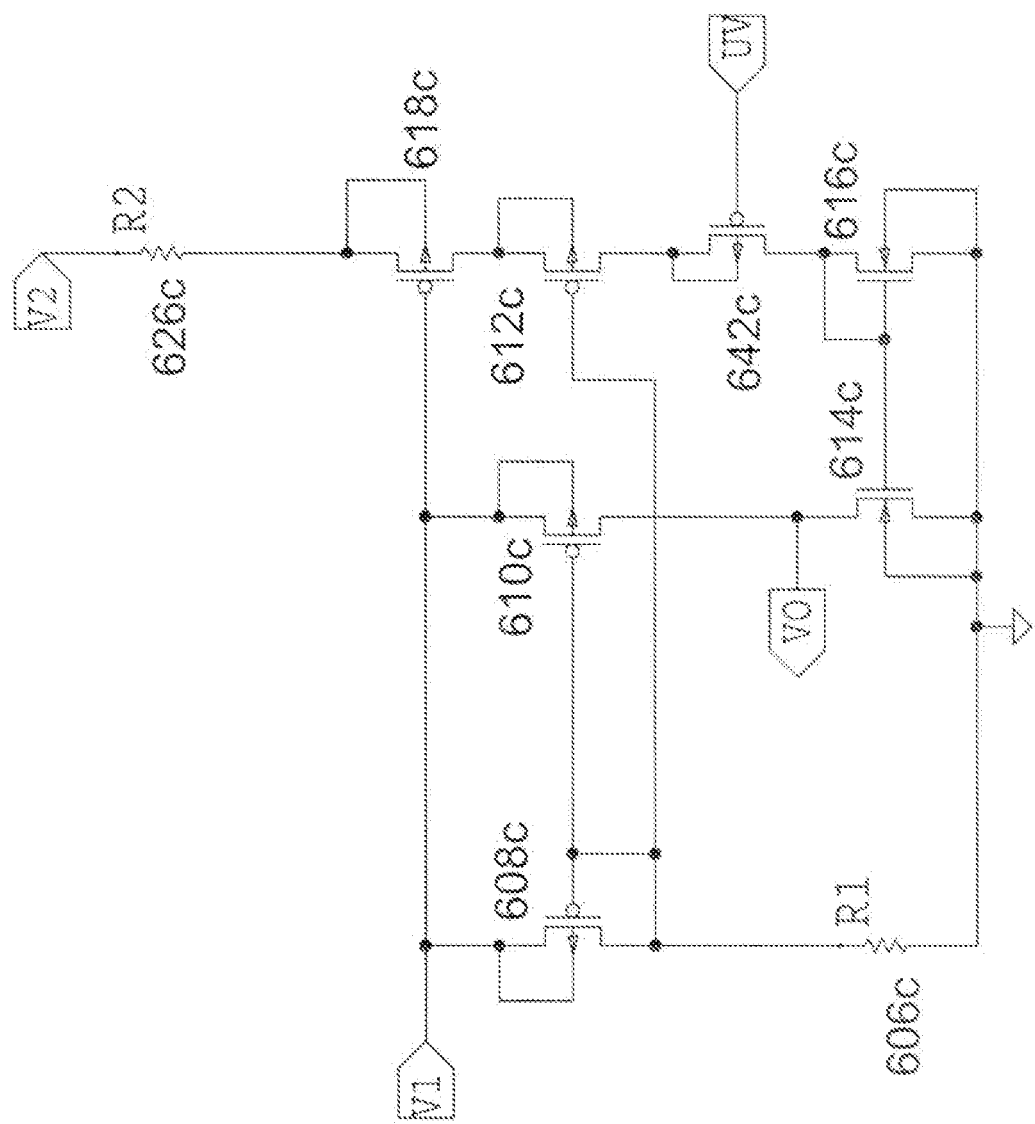
FIG. 16 illustrates yet another circuit implementation of a comparator of the present invention.

FIG. 16 illustrates yet another circuit implementation of a comparator of the present invention (e.g., the comparator CMP2X 578 illustrated in FIG. 13). A PMOS string of matched devices, including PMOS devices 618c, 608c, 610c, 612c, and 642c, NMOS devices 614c and 616c, and a resistor R1 606c can be connected in a similar circuit approach as that illustrated in FIG. 14. Now the body-connected source of the PMOS 618c connects to a resistor R2 626c. The other end of the resistor R2 626c connects to a voltage V2. The output is an output voltage VO. The PMOS 642c is connected in series between the NMOS 616c and the PMOS 612c. The body-connected source of the PMOS 642c connects to the drain of the PMOS 612c, and the drain of the PMOS 642c connects to the gate and drain of the NMOS 616c. In this case, the NMOS 616c and the NMOS 614c are a current mirror. The PMOS 612c matches to the PMOS 610c and the PMOS 608c. The signal UV can be applied to the gate of the PMOS 642c. It is noted that this is one method for combining the UV enable condition for the comparator CMP2X.

The CMP2X comparator 578c can be derived with a trip point determined by V2 602c equals two times a voltage V1. Here, the voltage V1 can be connected to the input voltage VIN. The charge-pump voltage PCP (illustrated in FIG. 13) connects to the voltage V2. The UV enable function is realized with the PMOS 642c. When the signal UV, connected to the gate of the PMOS 642c, is high, the PMOS 642c is off (e.g., blocking charge); this disables the comparator with the output voltage VO forced high. When the signal UV is low, the PMOS 642c conducts to allow comparison and circuit operation. This comparator CMP2X can dominate the regulation condition illustrated in FIG. 13 when the signal UV is low. It is noted that this is one example of an approach to include the UV enable function within the comparator CMP2X illustrated in FIG. 13.

Figure 17:
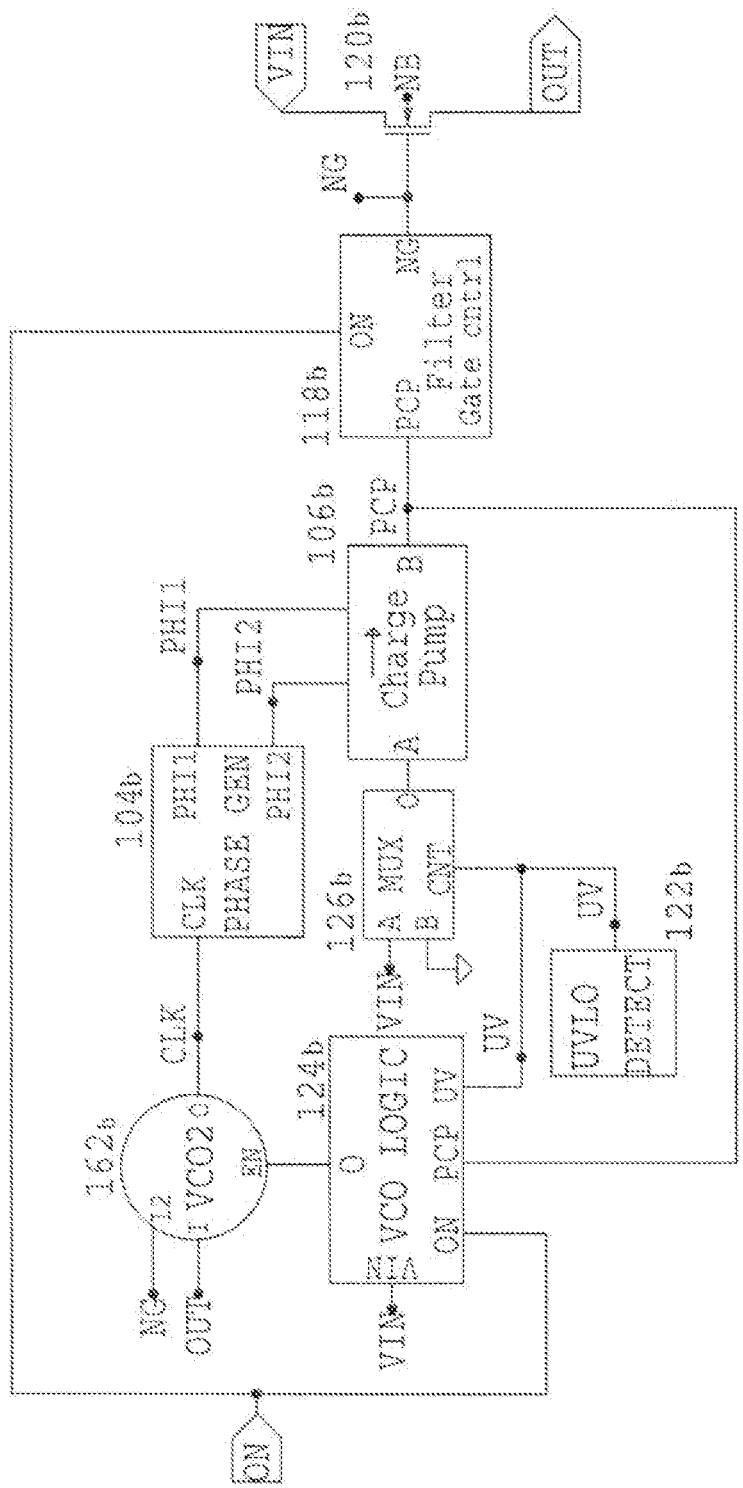
FIG. 17 illustrates an N-channel load switch system of the present invention.

FIG. 17 illustrates an N-channel load switch system of the present invention. An N-channel load switch system is similar to that illustrated in FIG. 10 with an exception that a different VCO is used, i.e., a VCO2 162b having an additional input port I2 is used. Here, the gate voltage NG connects directly to the input port I2 of the VCO 162b.

Figure 18:
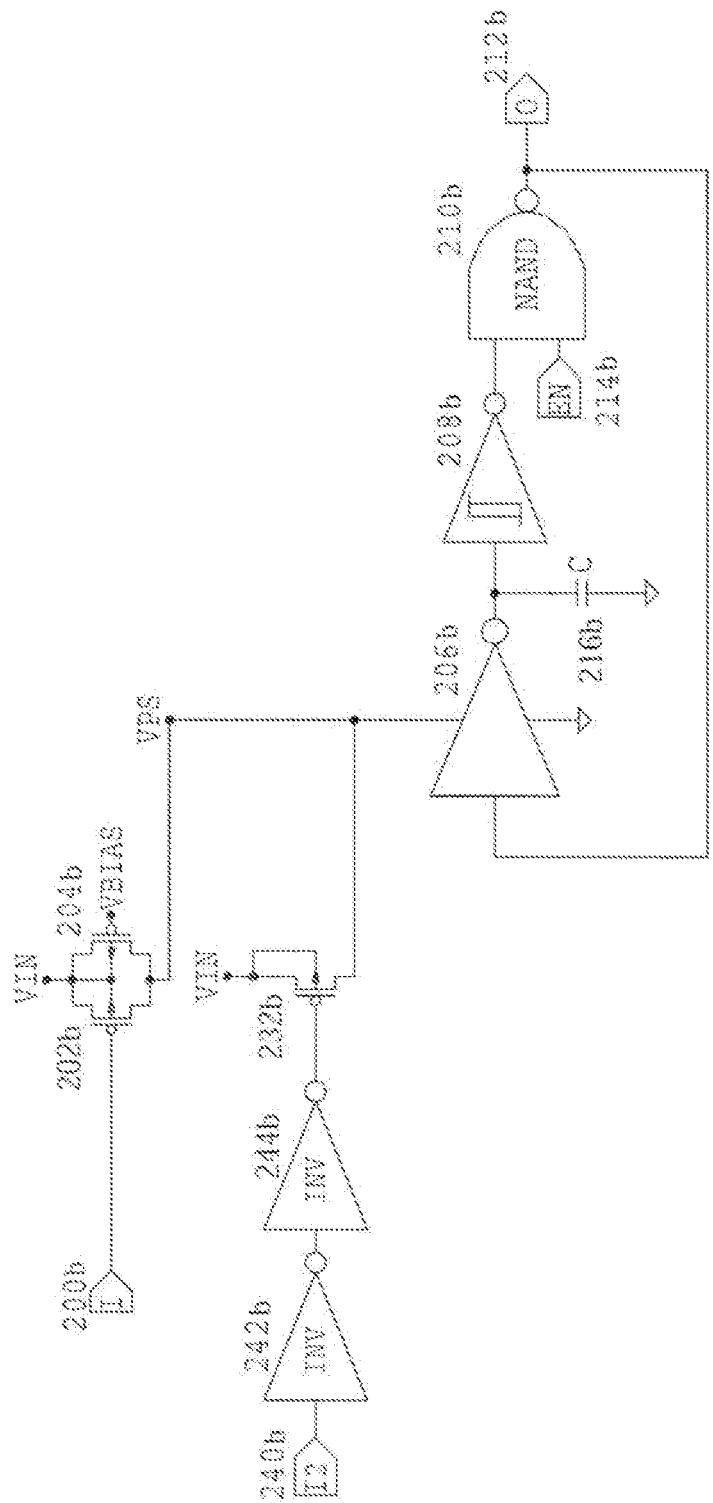
FIG. 18 illustrates a VCO for an N-channel load switch system of the present invention.

FIG. 18 illustrates a VCO for an N-channel load switch system of the present invention. A VCO for an N-channel load switch system of the present invention is similar to the VCO illustrated in FIG. 3, except that the comparator 230 illustrated in FIG. 3 is replaced by an inverter ("INV") 242b illustrated in FIG. 18. Referring to FIG. 18, the output of the inverter 242b can be connected to another inverter 244b, which then drives the gate of a PMOS 232b. The input of the inverter 242b is an additional port I2 240b.

The VCO illustrated in FIG. 18 can be used for the VCO2 162b illustrated in FIG. 17. Instead of using an input Ito a comparator, a simpler approach shown here uses two inverters including the inverter 242b with a low logic threshold. The inverter logic threshold should by design be close to an NMOS threshold. When the voltage at the input port I2 240b reaches the logic threshold, the inverter 242b drives the next inverter, which in turn drives the PMOS 232b off. Thus, this circuit is simpler and lends itself nicely to the N-channel load switch system illustrated in FIG. 10.

Figure 19:
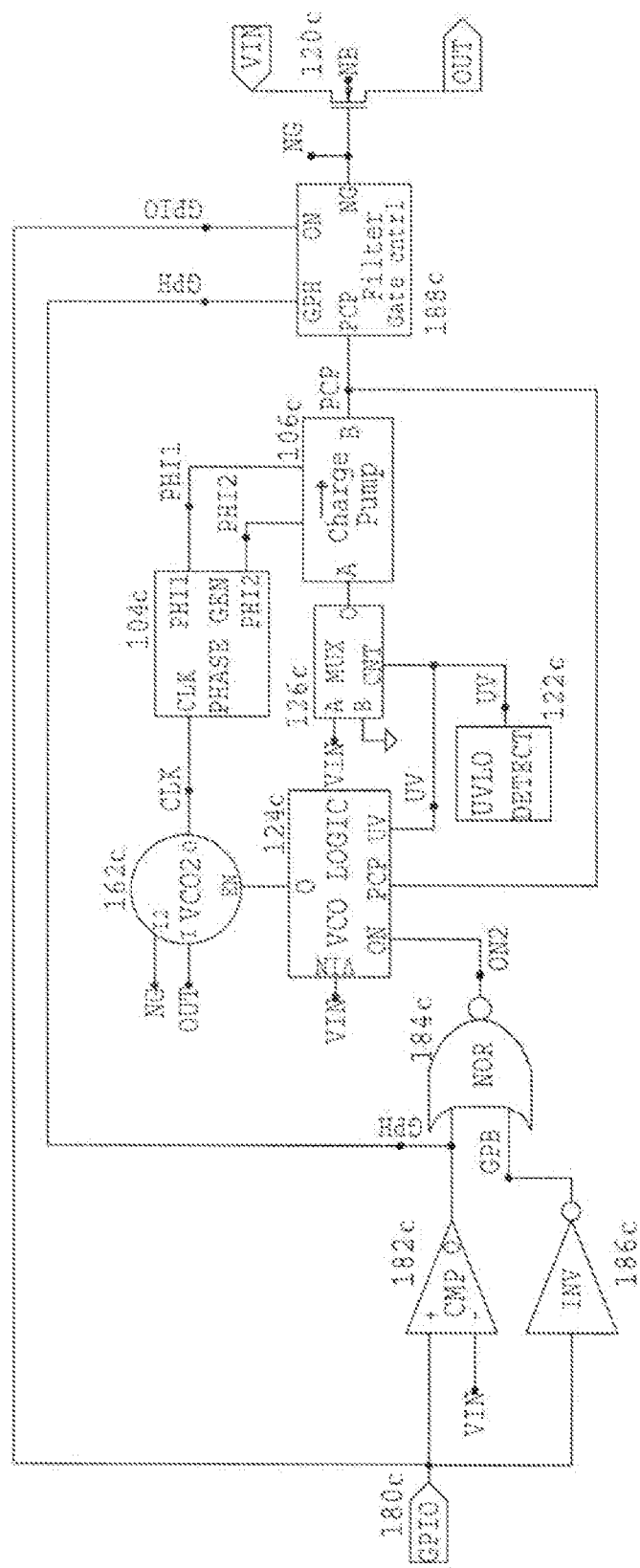
FIG. 19 illustrates another embodiment of an N-channel load switch system of the present invention.

FIG. 19 illustrates another embodiment of an N-channel load switch system of the present invention. In this embodiment, the N-channel load switch system is similar to that of FIG. 10 and FIG. 17. However, referring to FIG. 19, this system uses a different filter and gate control block, i.e., a filter and gate control block 188c is used. Here, a VCO 162c can be similar to that discussed in-part in the description of FIG. 18 or, however, discussed in part in the description of FIG. 10. In addition to the new filter and gate control block 188c, an input logic has been modified to allow a new input voltage GPIO 180c.

The GPIO 180c connects to the filter and the gate control block 188c, to the non-inverting input of a comparator 182c, and to the input of an inverter 186c. An input voltage VIN connects to the inverting input of the comparator 182c. The voltage GPH of the comparator 182c connects to an input of a NOR gate 184c and to an input, a GPH port, of the new filter and gate control block 188c. The output of the inverter 186c connects to the other input of the NOR gate 184c. The output of the NOR gate 184c connects to an ON port of the VCO logic block 124c.

Here, an additional rail, such as a GPIO line, becomes available to control the GPIO input 180c. This integrated circuit retains the functionality of the load switch illustrated in FIG. 10, but when the GPIO input 180c takes on a value greater than the input voltage VIN, the charge pump is no longer necessary. Under these circumstances, the GPIO input 180c may be used to directly drive the N-channel load switch 120c. In order to add this extra feature, the NOR gate 184c, the inverter INV 186c, and the comparator 182c can be added between the ON port of the VCO logic block 124c and the GPIO 180c. Additionally, a new filter and gate control block 188c is required.

The charge pump is used when an output ON2 of the NOR gate 184c is high. This can occur when the GPIO input 180c is a logic high signal but less than the input voltage VIN. When the GPIO is a true supply signal greater than the input voltage VIN and suitable for driving the N-channel 120c, the output ON2 is low and the new filter and gate control block 188c allows a direct path between the GPIO input 180c and the gate of the load switch 120c.

Figure 20:
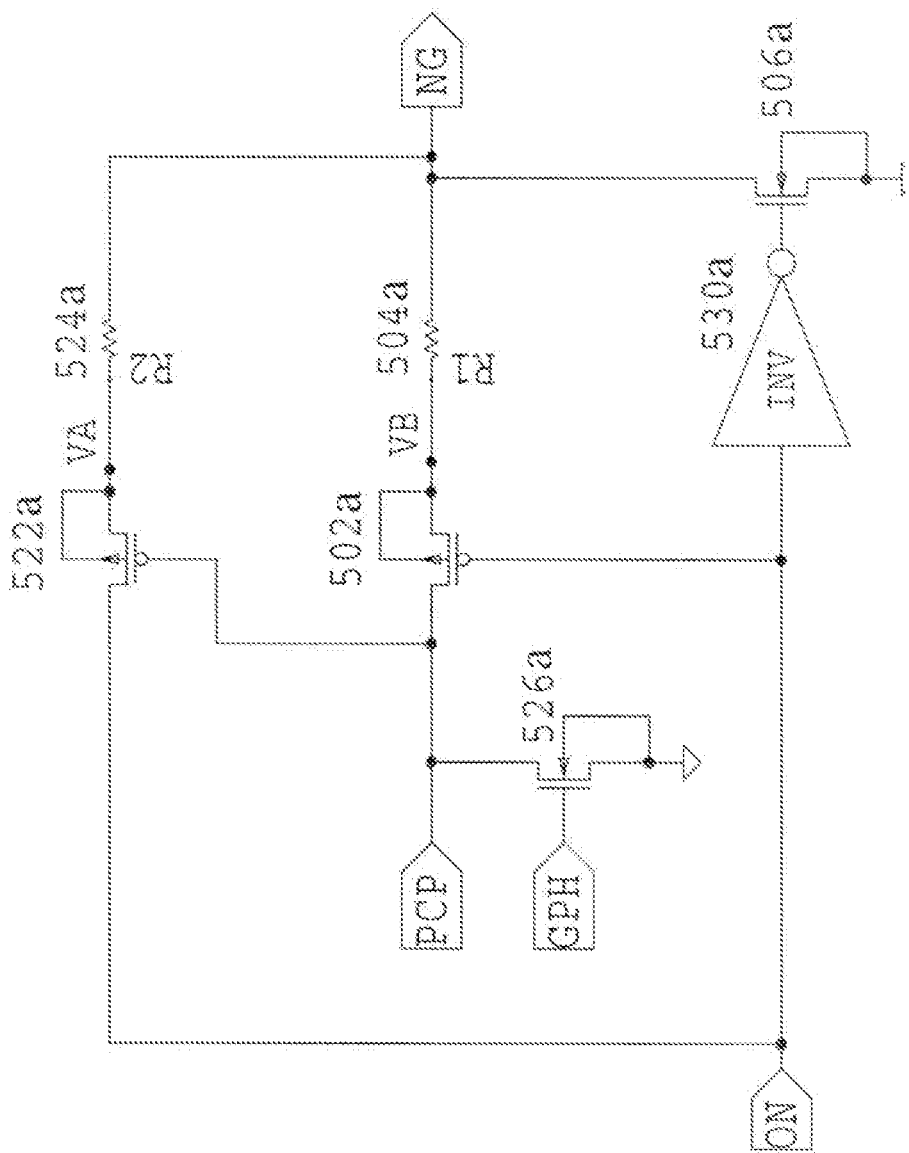
FIG. 20 illustrates a circuit diagram for a filter and gate control block of an N-channel load switch system of the present invention.

FIG. 20 illustrates a circuit diagram for a filter and gate control block of an N-channel load switch system of the present invention (e.g., the filter and gate control block 188c illustrated in FIG. 19). A charge pump voltage PCP can be applied to the following: the drain of a PMOS 502a; the drain of an NMOS 526a; and the gate of a PMOS 522a. An input voltage GPH can be applied at the gate of an NMOS 526a. The body-connected source of a PMOS 502a connects to a resistor R1 504a at a node VB. The other end of the resistor R1 504a connects to the gate voltage NG. The body-connected source of the NMOS 526a connects to ground.

The input signal ON connects to the following: the input of an inverter 530a; the drain of the PMOS 522a; and the gate of the PMOS 502a. The body-connected source of the PMOS 522a connects to a resistor R2 524a at a node VA. The other end of the resistor R2 524a connects to the gate voltage NG. The output of the inverter 530a connects to the gate of the NMOS 506a. The body-connected source of the NMOS 506a connects to ground, and the drain of the NMOS 506a connects to the gate voltage NG.

The filter and gate control block can be used for the filter and gate control block 188c illustrated in FIG. 19. This can be a modification of the filter and gate control block illustrated in FIG. 11. However, referring to FIG. 20, the gate and control block comprises the NMOS 526, the PMOS 522, and the resistor R2 524. Furthermore, the input signal ON can be the GPIO voltage 180c illustrated in FIG. 19. The voltage GPH is the output of the comparator 182c illustrated in FIG. 19.

When the voltage potential of the input signal ON is a normal logic high, but less than or equal to the input voltage VIN, the voltage GPH is low and the functionality is similar to the circuit illustrated in FIG. 11. When the input signal ON is low, the inverter 530c is high and the NMOS 506c pulls the gate voltage NG low.

When the input signal ON is a normal logic high but less than the input voltage VIN, the positive charge pump voltage PCP drives the gate of PMOS 522c to the highest potential such that it can block current. The gate having the gate voltage NG is charged through the PMOS 502c in this case.

When the voltage potential of the input signal ON is a voltage above the input voltage VIN, suitable for driving the respective gate having the gate voltage NG, then the voltage GPH is high and the voltage PCP is pulled to ground. The PMOS 502c is gated to the highest potential and blocks current. The PMOS 522c is gated low to allow current flow through the slew resistor R2 524c to the respective gate having the gate voltage NG. The slew resistors R2 524c and R1 504c may be chosen accordingly for filtering and slew rate control. The PMOS 522c and PMOS 502c are connected with the body-connected source connected to the branch resistor, R2 524c or R1 504c, respectively.

In alternative embodiments of the load switch system of the present invention, a load switch system can include driving heavier loaded systems such as internal rails or to drive an LDO system.

Also, FIG. 8 and FIG. 9 can have embodiments which relate to matching techniques and matching the gate-source voltage VGS of NMOS 436/436a and NMOS 450/450a. When the ratio of the resistor R1 432/432a and the resistor R2 448/448a are selected to equal the ratio of the voltage VGS of NMOS 436/436a to the voltage VGS of NMOS 450/450a, the trip point is independent of the voltage VGS and device parameters. These embodiments can be understood by a person having ordinary skill in circuit design. Furthermore, a circuit designer can have the freedom to change the ratios of current mirrors and resistor values. In general, any embodiment which allows the above matching and ratio condition is to be included as part of the present invention.

Figure 21:
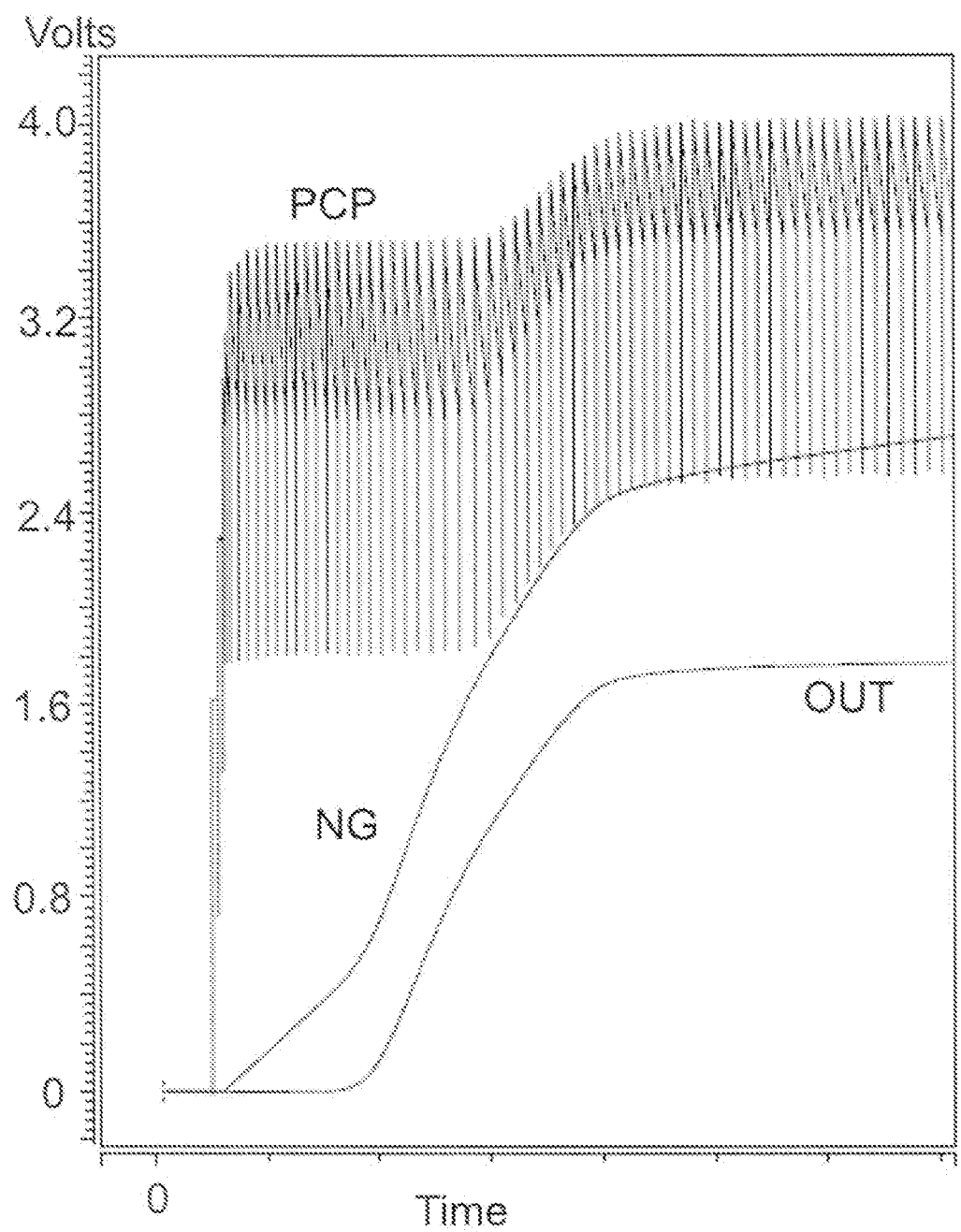
FIG. 21 illustrates a voltage versus time graph for a steady state and a transient state of an N-channel load switch system of the present invention.

FIG. 21 illustrates a voltage versus time graph for a steady state and a transient state of an N-channel load switch system of the present invention. In this example (or mode), the minimum charge pump frequency can be determined by the regulation of the voltage PCP to a peak value which is dependent upon the input voltage VIN and upon the output voltage OUT. Notice the ripple, due to switching in the positive-charge pump, is filtered to supply a smooth varying signal at the N-channel gate.

Figure 22:
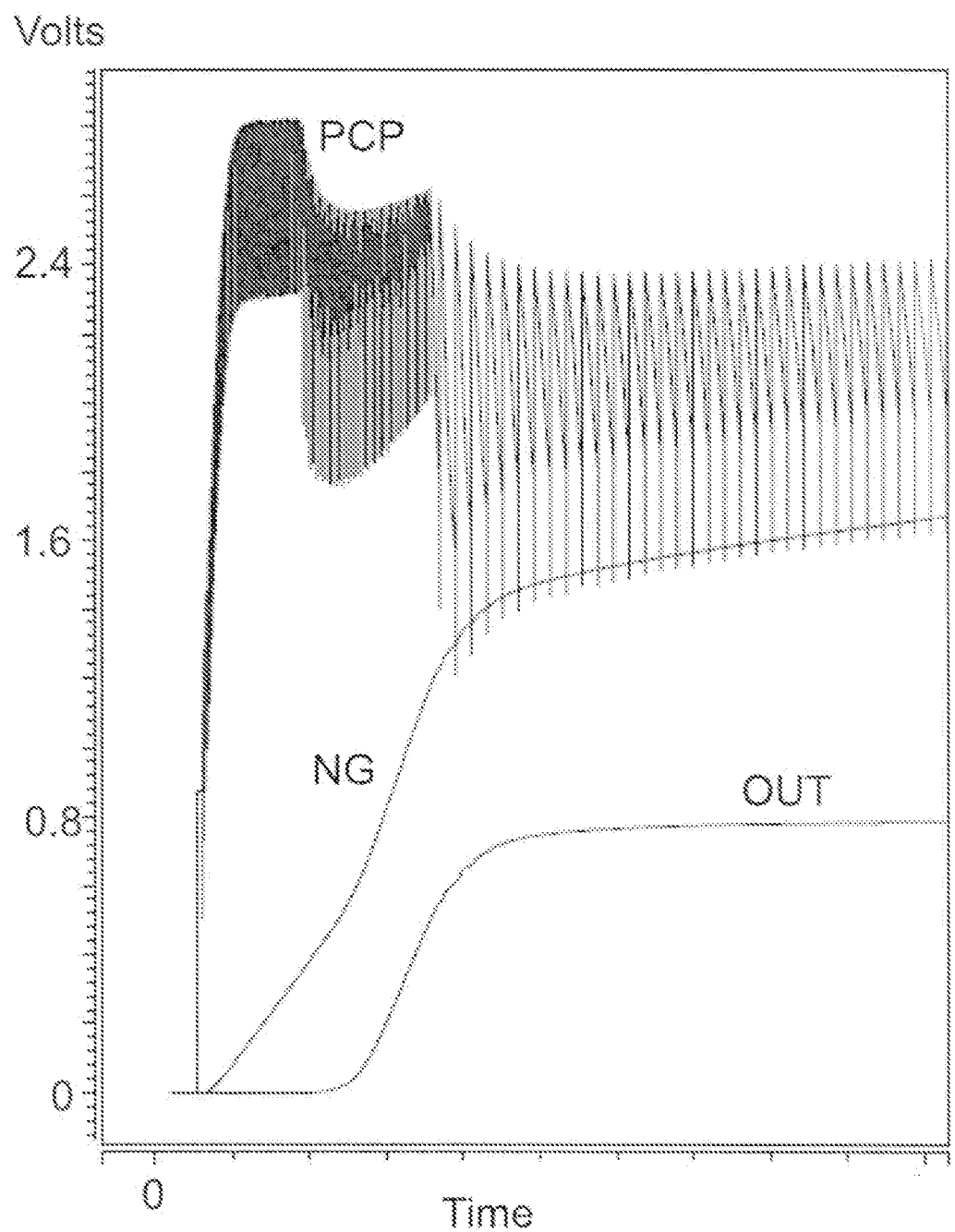
FIG. 22 illustrates another voltage versus time graph for a steady state and a transient state of an N-channel load switch system of the present invention.

FIG. 22 illustrates another voltage versus time graph for a steady state and a transient state of an N-channel load switch system of the present invention. In this example (or mode), the minimum charge pump frequency can be determined (e.g., dominated) by the control relationship between the load switch output voltage OUT and the oscillator frequency of the VCO. An additional dependence is shown between the gate voltage NG and the charge pump frequency (e.g., the oscillator frequency).

The charge pump frequency is illustrated through the ripples in the positive-charge pump voltage output PCP which takes on its maximum frequency when both the output voltage OUT and the gate voltage NG are low. As the gate voltage NG increases, the charge pump frequency decreases at one of the following rates: an inversely proportional rate, a constant rate, and a step-wise rate. And then, as the output voltage OUT rises, the charge pump frequency eventually reaches a minimum frequency during the steady state of the load switch. Again, filtering reduces the ripples in the signal to the gate of the N-channel load switch having the gate voltage NG.

Figure 23:
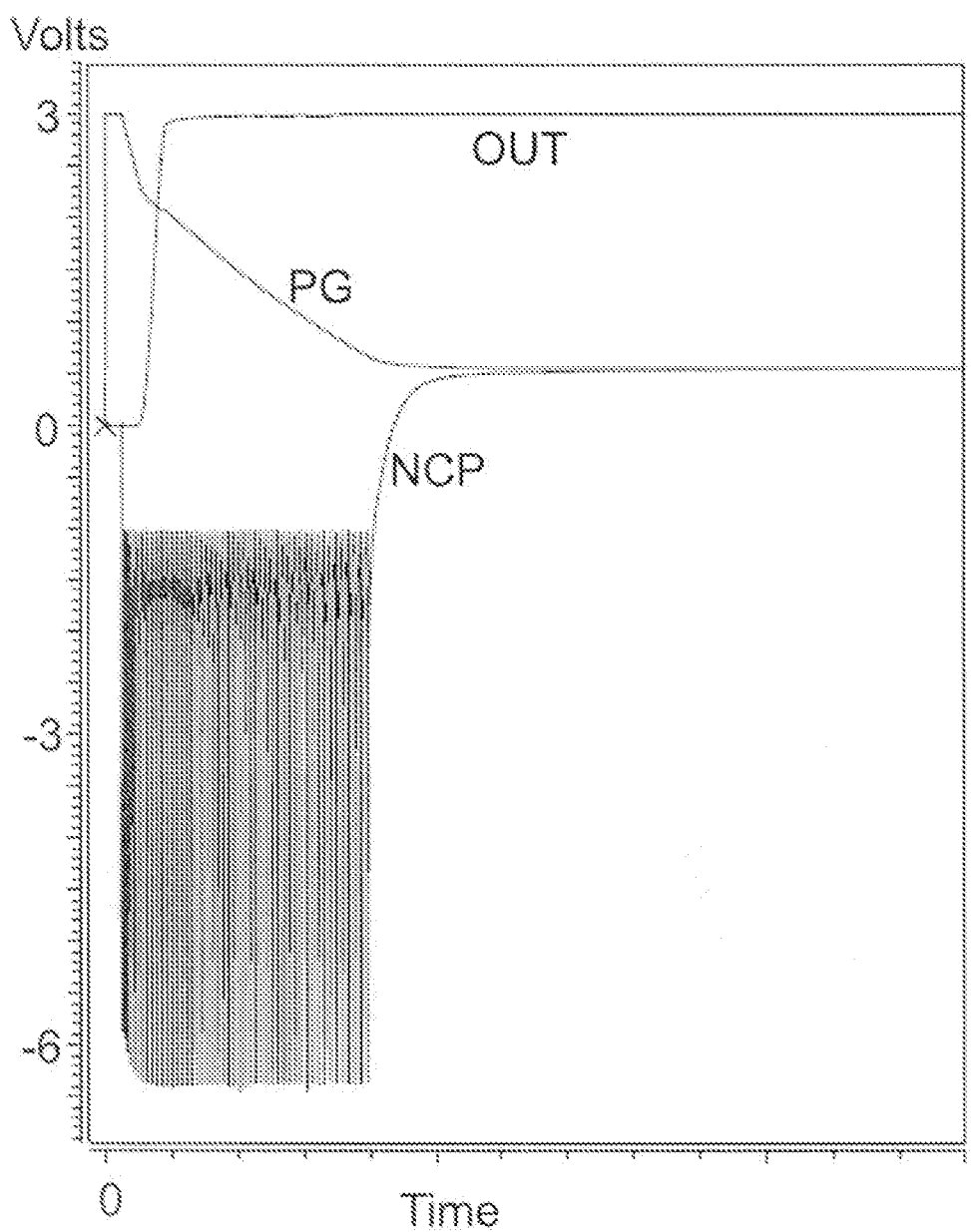
FIG. 23 illustrates a voltage versus time graph for a steady state and a transient state of a P-channel load switch system of the present invention.

FIG. 23 illustrates a voltage versus time graph for a steady state and a transient state of a P-channel load switch system of the present invention. In this special case (or mode), the minimum charge pump frequency occurs after the gate voltage PG falls below (e.g., reaches) a threshold value Vth1. Upon reaching the threshold value, the negative-charge pump is disabled (i.e., the oscillator is turned off), and is remained off for a long period, relative to the switching frequency. The charge pump cannot turn on until the gate voltage PG rises above a certain threshold value Vth2, where the value Vth2 can be independent from and higher than Vth1. Filtering reduces ripples occurring at the gate of the P-channel load switch due to the negative charge pump.

Figure 24:
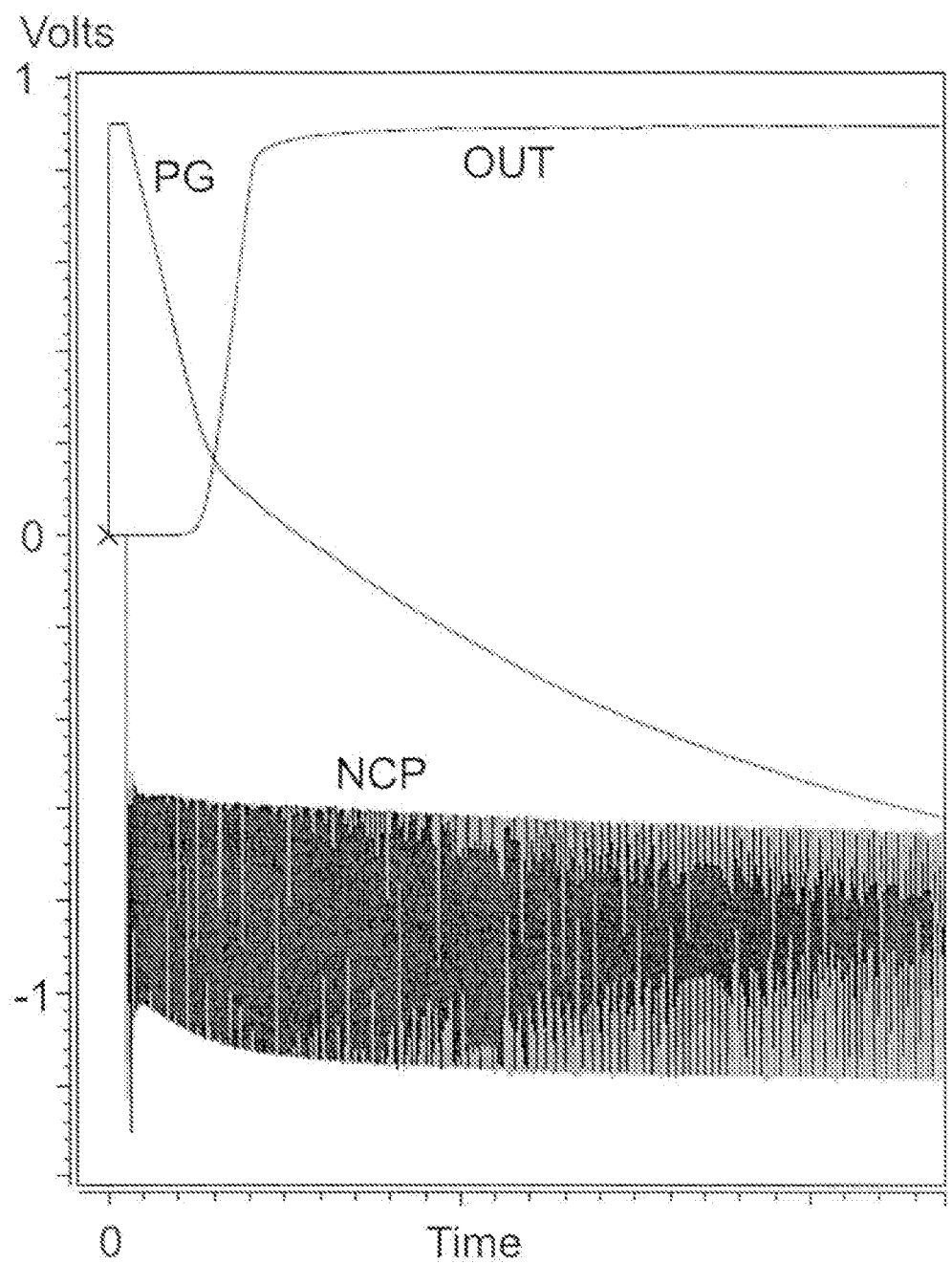
FIG. 24 illustrates another voltage versus time graph for a steady state and a transient state of a P-channel load switch system of the present invention.

FIG. 24 illustrates another voltage versus time graph for a steady state and a transient state of a P-channel load switch system of the present invention. In this case (or mode), the oscillator can run continuously and the minimum voltage value can be the final steady state value. In this mode, the oscillator can run continuously so as to supply sufficient gate drive (i.e., negative gate drive) to the P-channel load switch.

While the present invention has been described with reference to certain preferred embodiments or methods, it is to be understood that the present invention is not limited to such specific embodiments or methods. Rather, it is the inventor's contention that the invention be understood and construed in its broadest meaning as reflected by the following claims. Thus, these claims are to be understood as incorporating not only the preferred methods described herein but all those other and further alterations and modifications as would be apparent to those of ordinary skilled in the art.

I claim:

1. A method for operating a load switch, wherein a charge pump drives a gate of the load switch, comprising the steps of:
controlling a charge pump frequency as a function of control signals, wherein the control signals comprise an input voltage of the load switch, a gate voltage of the load switch, and an output voltage of the load switch;
generating a charge pump output as a function of the charge pump frequency; and
providing the charge pump output to the gate of the load switch,
wherein the output voltage of the load switch and an enable signal are inputted to a voltage controlled oscillator ("VCO") for generating the charge pump frequency, and wherein a VCO logic generates the enable signal as a function of the gate voltage of the load switch, the charge pump output, and the input voltage.

2. The method of 1 wherein the charge pump output is filtered by a filtering circuit before it is provided to the gate of the load switch, wherein the control signals further comprise the charge pump output, wherein the filtering circuit comprises a first transistor, a second transistor, and a resistor, wherein the charge pump voltage is connected to the source of the first transistor, wherein an on signal is connected to the gates of the first transistor and of the second transistor, wherein a first end of the resistor is connected to the drain of the first transistor, wherein a second end of the resistor is connected to the drain of the second transistor and the gate of the load switch, and wherein the source of the second transistor is connected to the input voltage.

3. The method of claim 1 in the controlling step, wherein the controlling of the charge pump frequency is further a function of states of the load switch and wherein the states of the load switch comprise a steady state and a transient state.

4. The method of claim 3 wherein during the steady state, the charge pump frequency is at a minimum frequency.

5. The method of claim 3 wherein during the transient state, the charge pump frequency decreases as an output of the load switch increases and wherein the charge pump frequency decreases at one of the following rates: an inversely proportional rate, a constant rate, and a step-wise rate.

6. The method of claim 3 wherein the load switch is an N-channel load switch and during the transient state, the charge pump frequency decreases as the gate voltage of the load switch increases, and wherein the charge pump frequency decreases at one of the following rates: an inversely proportional rate, a constant rate, and a step-wise rate.

7. The method of claim 3 wherein the load switch is an N-channel load switch and during the transient state, the charge pump frequency decreases as the gate voltage of the load switch increases and an output of the load switch increases.

8. The method of claim 1 wherein the charge pump output is regulated to a value proportional to the input voltage of the load switch.

9. The method of claim 8 wherein the load switch is an N-channel load switch and the value is also proportional to an output of the load switch.

10. The method of 1 wherein the load switch is a P-channel load switch and wherein the charge pump is disabled when the gate of the load switch is at or below a threshold value.

11. The method of 10 wherein the charge pump is enabled when the gate of the load switch exceeds the threshold value.

12. The method of claim 1 wherein the load switch is an N-channel load switch, wherein if an on signal of the load switch exceeds an input voltage of the load switch by a predetermined threshold, the charge pump is disabled and the on signal supplies voltage to the gate of the load switch.

13. A method for operating a load switch, wherein a charge pump drives a gate of the load switch, comprising the steps of:
controlling a charge pump frequency as a function of states of the load switch and as a function of control signals, wherein the states of the load switch comprise a steady state and a transient state;
generating a charge pump output as a function of the charge pump frequency, wherein during the steady state, the charge pump frequency is at a minimum frequency and wherein during the transient state, the charge pump frequency decreases as an output of the load switch increases;
filtering the charge pump output; and
providing the filtered charge pump output to the gate of the load switch,
wherein the control signals comprise an input voltage of the load switch, a gate voltage of the load switch, an output voltage of the load switch, and the charge pump output
wherein the charge pump output is regulated to a value proportional to the input voltage of the load switch,
wherein the gate voltage of the load switch, the output voltage of the load switch, and an enable signal are inputted to a voltage controlled oscillator ("VCO") for generating the charge pump frequency,
wherein a VCO logic generates the enable signal as a function of the input voltage of the load switch, an on signal, the charge pump output, and an under level detection signal,
wherein the under level detection signal indicates when the input voltage of the load switch is below a predefined voltage level,
wherein a general purpose input/output ("GPIO") voltage is compared to the input voltage, and
wherein when the GPIO voltage is greater than the input voltage, the GPIO voltage is used to drive the load switch and the charge pump is deactivated.

14. The method of claim 13 wherein the load switch is an N-channel load switch and during the transient state, the charge pump frequency further decreases as the gate voltage of the load switch increases, and wherein the charge pump frequency decreases at one of the following rates: an inversely proportional rate, a constant rate, and a step-wise rate.

15. The method of claim 13 wherein the load switch is an N-channel load switch and the value is also proportional to an output of the load switch.

16. The method of 13 wherein the load switch is a P-channel load switch and wherein the charge pump is disabled when the gate of the load switch is at or below a threshold value and wherein the charge pump is enabled when the gate of the load switch exceeds the threshold value.

17. The method of claim 13 wherein the load switch is an N-channel load switch, wherein if an on signal of the load switch exceeds an input voltage of the load switch by a predetermined threshold, the charge pump is disabled and the on signal supplies voltage to the gate of the load switch.

18. The method of claim 1 wherein the VCO logic comprises an under voltage detector circuit ("UVLO detector"), a multiplexer, a first comparator, a second comparator, a first flip-flop, a second flip-flop, a first inverter, a second inverter, and a NOR gate, wherein the input voltage is inputted to the UVLO detector, wherein the output of the UVLO detector is connected to the first inverter and to the multiplexer, wherein the first inverter is connected to a first input of the first flip-flop, wherein an output of the first flip-flop is connected to a first input of the NOR gate, wherein the multiplexer selects a reference voltage to compare with the charge pump output using the first comparator, wherein the output of the first comparator is connected to a first input of the second flip-flop and to a second input of the NOR gate, wherein the gate voltage of the load switch is compared with ground using the second comparator, wherein the output of the second comparator is connected to a second input of the second flip-flop, wherein an output of the second flip-flop is connected to a second input of the first flip-flop, wherein an on signal is inputted to the second inverter, wherein the output of the second inverter is connected to a third input of the NOR gate, and wherein the NOR gate generates the enable signal based on the first, second, and third inputs of the NOR gate.

19. The method of claim 1 wherein the VCO logic comprises a comparator, a multiplexer, a scalar multiplication logic block, an inverter, and a NOR gate, wherein the input voltage is connected to the scalar multiplication logic block for generating reference voltages as a function of the input voltage, wherein the reference voltages are inputted to the multiplexer, wherein an under voltage detection signal is inputted to the multiplexer, wherein the output of the multiplexer and the charge pump output are compared by the comparator, wherein the output of the comparator is connected to a first input of the NOR gate, wherein an on signal is inputted to the inverter, wherein the output of the inverter is connected to a second input of the NOR gate, and wherein the NOR gate outputs the enable signal as a function of the first input and the second input.

20. The method of claim 13 wherein the VCO logic comprises an under voltage detector circuit ("UVLO detector"), a multiplexer, a first comparator, a second comparator, a first flip-flop, a second flip-flop, a first inverter, a second inverter, and a NOR gate, wherein the input voltage is inputted to the UVLO detector, wherein the output of the UVLO detector is connected to the first inverter and to the multiplexer, wherein the first inverter is connected to a first input of the first flip-flop, wherein an output of the first flip-flop is connected to a first input of the NOR gate, wherein the multiplexer selects a reference voltage to compare with the charge pump output using the first comparator, wherein the output of the first comparator is connected to a first input of the second flip-flop and to a second input of the NOR gate, wherein the gate voltage of the load switch is compared with ground using the second comparator, wherein the output of the second comparator is connected to a second input of the second flip-flop, wherein an output of the second flip-flop is connected to a second input of the first flip-flop, wherein an on signal is inputted to the second inverter, wherein the output of the second inverter is connected to a third input of the NOR gate, and wherein the NOR gate generates the enable signal based on the first, second, and third inputs of the NOR gate.

21. The method of claim 13 wherein the VCO logic comprises a comparator, a multiplexer, a scalar multiplication logic block, an inverter, and a NOR gate, wherein the input voltage is connected to the scalar multiplication logic block for generating reference voltages as a function of the input voltage, wherein the reference voltages are inputted to the multiplexer, wherein an under voltage detection signal is inputted to the multiplexer, wherein the output of the multiplexer and the charge pump output are compared by the comparator, wherein the output of the comparator is connected to a first input of the NOR gate, wherein an on signal is inputted to the inverter, wherein the output of the inverter is connected to a second input of the NOR gate, and wherein the NOR gate outputs the enable signal as a function of the first input and the second input.

* * * * *